United States Patent
Song

(10) Patent No.: US 11,901,008 B2
(45) Date of Patent: Feb. 13, 2024

(54) THREE-DIMENSIONAL FLASH MEMORY AND OPERATION METHOD THEREFOR

(71) Applicant: Samsung Electronics Co., Ltd., Suwon-si (KR)

(72) Inventor: Yunheub Song, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 201 days.

(21) Appl. No.: 17/605,200

(22) PCT Filed: Apr. 22, 2020

(86) PCT No.: PCT/KR2020/005296
§ 371 (c)(1),
(2) Date: Oct. 20, 2021

(87) PCT Pub. No.: WO2020/218809
PCT Pub. Date: Oct. 29, 2020

(65) Prior Publication Data
US 2022/0223208 A1    Jul. 14, 2022

(30) Foreign Application Priority Data

Apr. 22, 2019  (KR) .................. 10-2019-0046872
Apr. 30, 2019  (KR) .................. 10-2019-0050335
(Continued)

(51) Int. Cl.
*G11C 16/00*    (2006.01)
*G11C 16/04*    (2006.01)
(Continued)

(52) U.S. Cl.
CPC .......... *G11C 16/0483* (2013.01); *G11C 16/08* (2013.01); *G11C 16/14* (2013.01);
(Continued)

(58) Field of Classification Search
CPC ..... G11C 16/0483; G11C 16/26; G11C 16/08; G11C 2029/1202; G11C 29/025;
(Continued)

(56) References Cited

U.S. PATENT DOCUMENTS 7,928,501 B2    4/2011   Kwon et al.
8,837,228 B2    9/2014   Nam et al.
(Continued)

FOREIGN PATENT DOCUMENTS

JP    2016040750 A    3/2016
JP    2019504479 A    2/2019
(Continued)

OTHER PUBLICATIONS

Final Office Action dated Oct. 20, 2020 for corresponding KR Application No. 10-2019-0050335.
(Continued)

*Primary Examiner* — Thong Q Le
(74) *Attorney, Agent, or Firm* — Muir Patent Law, PLLC

(57) ABSTRACT

A three-dimensional flash memory is disclosed. According to one embodiment, the three-dimensional flash memory has a structure in which a boosting area is reduced, a structure to which a small block is applied, a structure to which a COP is applied and in which a wiring process is simplified, or a structure to which symmetrical U-shaped BiCS are applied.

20 Claims, 34 Drawing Sheets

(30) Foreign Application Priority Data

May 14, 2019 (KR) ........................ 10-2019-0056135
May 17, 2019 (KR) ........................ 10-2019-0058286

(51) Int. Cl.

| | |
|---|---|
| *G11C 16/08* | (2006.01) |
| *G11C 16/14* | (2006.01) |
| *G11C 16/24* | (2006.01) |
| *G11C 16/26* | (2006.01) |
| *G11C 16/30* | (2006.01) |
| *H10B 41/27* | (2023.01) |
| *H10B 43/27* | (2023.01) |

(52) U.S. Cl.

CPC .............. *G11C 16/24* (2013.01); *G11C 16/26* (2013.01); *G11C 16/30* (2013.01); *H10B 41/27* (2023.02); *H10B 43/27* (2023.02)

(58) Field of Classification Search

CPC . G11C 16/10; G11C 16/00; G11C 2029/4402; G11C 2213/75; G11C 29/789; G11C 16/16; G11C 16/04; G11C 16/30; G11C 29/028; G11C 16/0408; G11C 11/5642; G11C 16/02; G11C 16/24; G11C 29/04; G11C 29/50004; G11C 5/02; G11C 5/06; G11C 16/14; G11C 16/3459; G11C 29/88; G11C 11/5628; G11C 16/3427; G11C 2029/0411; G11C 2029/1204; G11C 11/56; G11C 16/32; G11C 16/34; G11C 29/021; G11C 29/76; G11C 8/08; G11C 11/5635; G11C 13/0002; G11C 13/0004; G11C 13/0007; G11C 13/0023; G11C 13/0026; G11C 13/0033; G11C 13/0097; G11C 13/025; G11C 16/0466; G11C 16/3409; G11C 16/3418; G11C 16/344; G11C 16/349; G11C 2211/5642; G11C 2213/71; G11C 29/44; G11C 29/70; G11C 7/04; G11C 7/10; G11C 7/12; G11C 7/14; G11C 11/24; G11C 11/40; G11C 11/4091

USPC ............ 365/185.11, 185.17, 185.09, 185.02, 365/185.23, 189.05, 200, 230.03, 230.06, 365/66

See application file for complete search history.

(56) References Cited

U.S. PATENT DOCUMENTS

| | | | |
|---|---|---|---|
| 9,035,372 | B2 | 5/2015 | Song |
| 9,111,617 | B2 | 8/2015 | Shim et al. |
| 9,431,420 | B2 | 8/2016 | Hwang |
| 9,620,217 | B2 | 4/2017 | Lue et al. |
| 9,691,473 | B2 * | 6/2017 | Yang .................... G11C 13/025 |
| 9,691,782 | B1 | 6/2017 | Hwang et al. |
| 9,799,672 | B2 | 10/2017 | Son et al. |
| 9,837,419 | B2 | 12/2017 | Oh et al. |
| 9,887,208 | B2 | 2/2018 | Son et al. |
| 9,893,077 | B2 | 2/2018 | Nam et al. |
| 10,128,263 | B2 | 11/2018 | Baek et al. |
| 10,283,204 | B2 | 5/2019 | Choi et al. |
| 10,373,972 | B2 | 8/2019 | Park et al. |
| 10,396,093 | B2 | 8/2019 | Song et al. |
| 2016/0149004 | A1 | 5/2016 | Rabkin et al. |
| 2018/0233206 | A1 | 8/2018 | Yu et al. |
| 2019/0355743 | A1 | 11/2019 | Song |
| 2019/0371407 | A1 * | 12/2019 | Yamaoka ............... H10B 41/40 |

FOREIGN PATENT DOCUMENTS

| | | |
|---|---|---|
| KR | 1020090125893 A | 12/2009 |
| KR | 1020100004772 A | 1/2010 |
| KR | 1020130035553 A | 4/2013 |
| KR | 1020130042272 A | 4/2013 |
| KR | 101263182 B1 | 5/2013 |
| KR | 1020160006866 A | 1/2016 |
| KR | 1020160095557 A | 8/2016 |
| KR | 1020160112780 A | 9/2016 |
| KR | 1020160123081 A | 10/2016 |
| KR | 1020160143982 A | 12/2016 |
| KR | 1020170055069 A | 5/2017 |
| KR | 1020170076868 A | 7/2017 |
| KR | 1020170124019 A | 11/2017 |
| KR | 1020180057260 A | 5/2018 |
| KR | 1020180096877 A | 8/2018 |
| KR | 1020190040592 A | 4/2019 |
| KR | 1020190040880 A | 4/2019 |

OTHER PUBLICATIONS

First Office Action dated Mar. 25, 2020 for corresponding Korean Application No. 10-2019-0046872.
International Search Report dated Jul. 29, 2020.
Notice of Allowance dated Mar. 6, 2021 for corresponding KR Application No. 10-2019-0050335.
Notice of Allowance dated Nov. 6, 2020 for corresponding KR Application No. 10-2019-0056135.
Notice Of Allowance dated Oct. 14, 2020 for corresponding of KR Application No. 10-2019-0046872.
Notice of Allowance dated Oct. 29, 2020 for corresponding KR Application No. 10-2019-0058286.
Notice of Allowance dated Nov. 3, 2020 for corresponding KR Application No. 10-2019-0056135.
Final Office Action dated Oct. 30, 2020 for corresponding KR Application No. 10-2019-0050335.

* cited by examiner

THREE-DIMENSIONAL FLASH MEMORY AND OPERATION METHOD THEREFOR

TECHNICAL FIELD

The following embodiments relate to a three-dimensional (3D) flash memory and an operation method thereof.

BACKGROUND ART

A flash memory device is electrically erasable programmable read-only memory (EEPROM), which may be commonly used in, for example, a computer, a digital camera, an MPEG-1 audio layer 3 (MP3) player, a game system, a memory stick, and the like. The flash memory device electrically controls the input and output of data by Fowler-Nordheim (F-N) tunneling or hot electron injection.

Specifically, referring to FIG. 1, which shows an array of a conventional three-dimensional (3D) flash memory, the array of the 3D flash memory may include a common source line CSL, bit lines BL, and a plurality of cell strings CSTR connected in parallel between the common source line CSL and the bit lines BL.

The bit lines BL may be arranged two-dimensionally, and a plurality of cell strings CSTR may be connected in parallel to each of the bit lines BL. The cell strings CSTR may be connected in common to the common source line CSL. That is, a plurality of cell strings CSTR may be between a plurality of bit lines BL and one common source line CSL. In this case, common source lines CSL may be provided in plural, and a plurality of common source lines CSL may be two-dimensionally arranged between electrode structures 215. Here, electrically the same voltage may be applied to the plurality of common source lines CSL. Alternatively, each of the plurality of common source lines CSL may be electrically controlled.

Each of the cell strings CSTR may include a ground selection transistor GST connected to the common source line CSL, a string selection transistor SST connected to the bit line BL, and a plurality of memory cell transistors MCT between ground and string selection transistors GST and SST. In addition, the ground selection transistor GST, the string selection transistor SST, and the memory cell transistors MCT may be connected in series.

The common source line CSL may be connected in common to sources of the ground selection transistors GST. Furthermore, a ground selection line GSL, a plurality of word lines (e.g., WL0 to WL3), and a plurality of string selection lines SSL, which are between the common source line CSL and the bit line BL, may be respectively used as electrode layers of the ground selection transistor GST, the memory cell transistors MCT, and the string selection transistors SST. Also, each of the memory cell transistors MCT may include a memory element. Hereinafter, the string selection line SSL may be expressed as an upper selection line (USL), and the ground selection line GSL may be expressed as a lower selection line (LSL).

Meanwhile, to meet excellent performance and low price, which are demanded by consumers, a conventional 3D flash memory is increasing integration density by vertically stacking cells.

For example, referring to FIG. 2, which shows a structure of the conventional 3D flash memory, the conventional 3D flash memory is manufactured by arranging the electrode structure 215, in which interlayer insulating layers 211 and horizontal structures 250 are alternately and repeatedly arranged, on a substrate 200. The interlayer insulating layers 211 and the horizontal structures 250 may extend in a first direction. The interlayer insulating layers 211 may be, for example, silicon oxide films. A lowermost interlayer insulating layer 211a of the interlayer insulating layers 211 may have a smaller thickness than the other interlayer insulating layers 211. Each of the horizontal structures 250 may include first and second blocking insulating films 242 and 243 and an electrode layer 245. The electrode structures 215 may be provided in plural, and a plurality of electrode structures 215 may be arranged to face each other in a second direction that intersects with the first direction. The first and second directions may respectively correspond to an x-axis and a y-axis of FIG. 2. Trenches 240 configured to space the plurality of electrode structures 215 from each other may be extend in the first direction between the plurality of electrode structures 215. The common source line CSL may be arranged by forming heavily doped impurity regions in the substrate 200 exposed by the trenches 240. Although not shown, isolation insulating films may be further located to fill the trenches 240.

Vertical structures 230 may be disposed to pass through the electrode structure 215. As an example, in a view from above, the vertical structures 230 may be arranged in a matrix form in the first and second directions. In another example, the vertical structures 230 may be arranged in the second direction and located to be zigzag in the first direction. Each of the vertical structures 230 may include a protective film 224, a charge storage film 225, a tunnel insulating film 226, and a channel layer 227. In an example, the channel layer 227 may be arranged in a hollow tube form. In this case, a buried film 228 may be further located to fill the inside of the channel layer 227. A drain region D may be on the channel layer 227, and a conductive pattern 229 may be formed on the drain region D and connected to the bit line BL. The bit line BL may extend in a direction (e.g., the second direction) that intersects with the horizontal electrodes 250. In an example, the vertical structures 230 arranged in the second direction may be connected to one bit line BL.

The first and second blocking insulating films 242 and 243 included in the horizontal structures 250 and the charge storage film 225 and the tunnel insulating film 226 included in the vertical structures 230 may be defined by an oxide-nitride-oxide (ONO) layer, which is an information storage element of the 3D flash memory. That is, a portion of the information storage element may be included in the vertical structures 230, and a remaining portion thereof may be included in the horizontal structures 250. In an example, of the information storage element, the charge storage film 225 and the tunnel insulating film 226 may be included in the vertical structures 230, and the first and the second blocking insulating films 242 and 243 may be included in the horizontal structures 250.

Epitaxial patterns 222 may be between the substrate 200 and the vertical structures 230. The epitaxial patterns 222 may connect the substrate 200 to the vertical structures 230. The epitaxial patterns 222 may be in contact with at least one layer of the horizontal structures 250. That is, the epitaxial patterns 222 may be in contact with a lowermost horizontal structure 250a. According to another embodiment, the epitaxial patterns 222 may be in contact with a plurality of layers (e.g., two layers) of the horizontal structures 250. Meanwhile, when the epitaxial patterns 222 are in contact with the lowermost horizontal structure 250a, the lowermost horizontal structure 250a may be arranged to a greater thickness than the other horizontal structures 250. The lowermost horizontal structure 250a in contact with the epitaxial patterns 222 may correspond to the ground selection line GSL of the array of the 3D flash memory described with reference to FIG. 1, and the remaining horizontal structures 250 in contact with the vertical structures 230 may correspond to the plurality of word lines (e.g., WL0 to WL3).

Each of the epitaxial patterns 222 may have a recessed sidewall 222a. Accordingly, the lowermost horizontal structure 250a in contact with the epitaxial patterns 222 may be arranged along a profile of the recessed sidewall 222a. That is, the lowermost horizontal structure 250a may be arranged in an inwardly convex shape along the recessed sidewall 222a of the epitaxial patterns 222.

In the conventional 3D flash memory having the structure described above, as the vertically stacked number of cells increases, a boosting area increases. Thus, problems of speed reduction and an increase in power consumption related to a pass voltage applied to an unselected word line are caused during a program operation, and a problem of an increase in a bulk potential rise time and an increase in hole injection time are caused during an erase operation.

Accordingly, there is a need to propose a technique for solving the above-described problems.

Meanwhile, a small block technique has been proposed to improve the efficiency of an erase operation in a 3D flash memory. A small block refers to a minimum unit in which memory regions to be erased are grouped.

However, to apply the small block, there is a problem that a word line wiring configured to control word lines that apply a voltage to the vertical structures 230 in the 3D flash memory should be independently provided for each word line to correspond to the small blocks. Thus, because the word line wiring is independently provided for each word line, a space for arranging word line wirings should be ensured, resulting in a disadvantage that integration density is reduced.

Accordingly, there is a need to propose a technique for overcoming problems and disadvantages caused by applying a small block to the structure of the conventional 3D flash memory.

Furthermore, in recent years, a 3D structure in which cells are vertically stacked to increase integration density has been applied to meet excellent performance and low price, which are demanded by consumers. Referring to FIG. 16, which shows the conventional 3D flash memory, a 3D flash memory 1600 has a structure including a channel layer 1610 formed in a vertical direction, a charge storage layer 1620 formed to surround the channel layer 1610, a plurality of electrode layers 1630 connected to the charge storage layer 1620 and stacked in a horizontal direction, and a plurality of insulating layers 1640 interposed between the plurality of electrode layers 1630 to alternate with the plurality of electrode layers 1630. Hereinafter, the charge storage layer 1620 and the channel layer 1610, which are components directly related to the storing and reading of data, may be referred to as a memory cell string.

The conventional 3D flash memory 1600 having the above-described structure may apply a cell-on-peripheral circuit (COP) technique for burying a memory cell transistor 1650 related to the memory cell string (a transistor directly related to data storage and read operations of the memory cell string or a transistor used to connect the memory cell string to a source electrode) and at least one peripheral-portion transistor 1660 related to an operation of the 3D flash memory 1600 (a transistor excluding the memory cell transistor 1650, from among transistors related to the operation of the 3D flash memory 1600) in a substrate 1670 and improve space utilization to increase integration density.

However, the conventional 3D flash memory 1600 has a disadvantage of a complicated wiring process because the memory cell transistor 1650 and the at least one peripheral-portion transistor 1660 are not distinguished and are buried in the substrate 1670.

Accordingly, there is a need to propose a 3D flash memory to which a COP technique overcoming the disadvantage is applied.

In addition, because a bit cost scalable (BiCS) structure shown in FIGS. 20 and 21 is applied to the 3D flash memory, integration density has further improved. In a 3D flash memory 200 to which BiCS structure is applied, a string 2010 has an asymmetric structure in which both ends of a U shape are formed to have different heights as shown, and thus, one end of the both ends is connected to a drain line formed to extend in an x-axial direction and the other end is connected to a source line formed to extend in a y-axial direction.

Accordingly, in the 3D flash memory 2000 to which a conventional BiCS structure is applied, various problems (a problem of weak recognition margins due to a reduction in cell current during a read operation, problems of speed reduction due to an increase in boosting area and an increase in power consumption related to a pass voltage applied to a word line due to an increase in the number of unselected word lines during a program operation, and problems of an increase in bulk potential rise time and an increase in hole injection time during an erase operation) may occur due to the string 2010 having the asymmetric structure.

Therefore, there is a need to propose a technique for solving the various problems caused by a string having an asymmetric structure.

DESCRIPTION OF EMBODIMENTS

Technical Problem

Embodiments propose a three-dimensional (3D) flash memory and an operation method thereof, by which a boosting area is reduced to improve speed during a program operation, reduce power consumption related to a pass voltage applied to an unselected word line, and reduce a bulk potential rise time and a hole injection time during an erase operation.

More specifically, embodiments propose a 3D flash memory and an operation method thereof, which use at least one word line, from among a plurality of word lines, as a middle signal line (MSL) configured to turn off a partial region of at least one string to perform a program operation on a specific memory cell in a remaining partial region, and deplete the partial region of the at least one string to perform an erase operation on the remaining partial region.

In addition, embodiments propose a 3D flash memory, which improves integration density and the efficiency of an erase operation.

More specifically, embodiments propose a 3D flash memory to which a small block is applied while allowing a word line wiring to be shared between word lines.

Furthermore, embodiments propose a 3D flash memory to which a cell-on-peripheral circuit (COP) technique in which a wiring process is simplified is applied.

More specifically, embodiments propose a 3D flash memory in which a substrate on which at least one memory cell string extends is formed to be divided into a cell region in which at least one memory cell transistor related to the at least one memory cell string and a peripheral portion region in which at least one peripheral-portion transistor is formed.

Embodiments propose a technique for fundamentally solving various problems caused by a string of an asymmetric structure.

More specifically, embodiments propose a 3D flash memory and an operation method thereof, in which vertical portions are symmetrical with respect to a horizontal portion in at least one string formed in a U shape to include the horizontal portion and the vertical portions with respect to a substrate.

Furthermore, embodiments propose a 3D flash memory and an operation method thereof, in which a word line located adjacent to an upper portion of a horizontal portion of at least one string, from among a plurality of word lines, is used as an MSL, and thus, a boosting area is reduced to effectively solve various problems caused by a string having an asymmetric structure.

Solution to Problem

According to an embodiment, a three-dimensional (3D) flash memory includes at least one string formed on a substrate to extend in one direction, wherein the at least one string includes at least one channel layer formed to extend in one direction and a charge storage layer formed to surround the at least one channel layer; and a plurality of word lines connected to the at least one string in a vertical direction. At least one word line of the plurality of word lines is used as a middle signal line (MSL) configured to turn off a partial region of the at least one string to perform a program operation on a specific memory cell on a remaining partial region, and to deplete the partial region of the at least one string to perform an erase operation on the remaining partial region.

According to an aspect of the present disclosure, the 3D flash memory may turn off the partial region of the at least one string by applying an off voltage for turning off a channel to the MSL, and perform the program operation on the specific memory cell on the remaining partial region.

According to another aspect of the present disclosure, the 3D flash memory may deplete the partial region of the at least one string by applying a blocking voltage for depleting a channel to the MSL, and perform the erase operation on the remaining partial region.

According to still another aspect of the present disclosure, the 3D flash memory may perform the erase operation on the remaining partial region by floating the MSL and word lines located in the partial region of the at least one string and applying a ground voltage to word lines located in the remaining partial region.

According to an embodiment, a 3D flash memory to which a small block is applied includes a plurality of memory cell strings formed on a substrate to extend in one direction, each memory cell string including a channel layer and a charge storage layer surrounding the channel layer, a plurality of word lines connected to the plurality of memory cell strings in a vertical direction, the plurality of word lines being grouped into a plurality of word line sets being grouped into a plurality of word line sets to respectively correspond to small blocks into which the plurality of memory cell strings are grouped, and at least one switching element connected to a word line wiring configured to control the plurality of word lines, the at least one switching element being configured to selectively apply a voltage to any one word line set of the plurality of word line sets.

According to an aspect of the present disclosure, the word line wiring may be shared between the small blocks.

According to an embodiment, a 3D flash memory to which a small block is applied includes at least one memory cell string formed on a substrate to extend in one direction, each one memory cell string including a channel layer and a charge storage layer surrounding the channel layer; a plurality of word lines connected to the at least one memory cell string in a vertical direction, the plurality of word lines being grouped into a plurality of word line sets to respectively correspond to small blocks into which vertical-direction memory regions of the at least one memory cell string are grouped; and at least one switching element connected to a word line wiring configured to control the plurality of word lines, the at least one switching element being configured to selectively apply a voltage to any one word line set of the plurality of word line sets.

According to an aspect of the present disclosure, the word line wiring may be shared between the small blocks.

According to an embodiment, a 3D flash memory to which a cell-on-peripheral circuit (COP) is applied includes a substrate; and at least one memory cell string formed on the substrate to extend in one direction, the at least one memory cell string including at least one channel layer and at least one charge storage layer surrounding the at least one channel layer. The substrate is formed to be divided into a cell region in which at least one memory cell transistor related to the at least one memory cell string is formed and a peripheral portion region in which at least one peripheral-portion transistor is formed, wherein the at least one peripheral-portion transistor is a remaining transistor excluding the at least one memory cell transistor, from among transistors related to an operation of the 3D flash memory.

According to an aspect of the present disclosure, the substrate may be formed as a multilayered structure in which a bulk polysilicon substrate used as the cell region is stacked on a silicon substrate used as the peripheral portion region.

According to another aspect of the present disclosure, the substrate may be formed as a single layer, the cell region may be in a central portion in which the at least one memory cell string is on the substrate, and the peripheral portion region may be in a peripheral portion surrounding the cell region on the substrate.

According to an embodiment, a 3D flash memory includes at least one string formed in a U shape to include a horizontal portion and vertical portions with respect to a substrate, the at least one string including a charge storage layer formed to extend in a hollow tube form and a channel layer filling an inside of the charge storage layer; a plurality of word lines orthogonal to and connected to the vertical portions of the at least one string; and two bit lines formed to extend parallel to the horizontal portion of the at least one string, the two bit lines being connected to both ends of the at least one string.

According to an aspect of the present disclosure, each of the two bit lines may be selectively used as either a drain line or a source line.

According to another aspect of the present disclosure, the two bit lines may be on the same plane as the both ends of the at least one string are located at the same height.

According to still another aspect of the present disclosure, a word line adjacent to an upper portion of the horizontal portion of the at least one string, from among the plurality of word lines, may be used as an MSL configured to deplete any one vertical portion of the vertical portions of the at least one string to perform a program operation on a specific memory cell on a remaining vertical portion, and to inject holes to all the vertical portions of the at least one string to perform an erase operation on the at least one string.

Advantageous Effects of Disclosure

Embodiments may provide a three-dimensional (3D) flash memory and an operation method thereof, which use at least one word line, from among a plurality of word lines, as a middle signal line (MSL) configured to turn off a partial region of at least one string to perform a program operation on a specific memory cell in a remaining partial region, and deplete the partial region of the at least one string to perform an erase operation on the remaining partial region.

Accordingly, embodiments may propose a 3D flash memory and an operation method thereof, by which a boosting area is reduced to improve speed during a program operation, reduce power consumption related to a pass voltage applied to an unselected word line, and reduce a bulk potential rise time and a hole injection time during an erase operation.

Furthermore, embodiments propose a 3D flash memory to which a small block is applied while allowing a word line wiring to be shared between word lines.

Therefore, embodiments may propose a 3D flash memory, which improves the efficiency of an erase operation while improving integration density.

In addition, embodiments may propose a 3D flash memory to which a COP in which a wiring process is simplified is applied.

More specifically, embodiments may propose a 3D flash memory in which a substrate on which at least one memory cell string extends is formed to be divided into a cell region in which at least one memory cell transistor related to the at least one memory cell string and a peripheral portion region in which at least one peripheral-portion transistor is formed.

Embodiments propose a 3D flash memory and an operation method thereof, in which vertical portions are symmetrical with respect to a horizontal portion in at least one string formed in a U shape to include the horizontal portion and the vertical portions with respect to a substrate.

Accordingly, embodiments may propose a technique of fundamentally solving various problems caused by a string of an asymmetric structure.

Furthermore, embodiments propose a 3D flash memory and an operation method thereof, in which a word line located adjacent to an upper portion of a horizontal portion of at least one string, from among a plurality of word lines, is used as an MSL, and thus, a boosting area is reduced to effectively solve various problems caused by a string having an asymmetric structure.

BEST MODE

Figure 1:
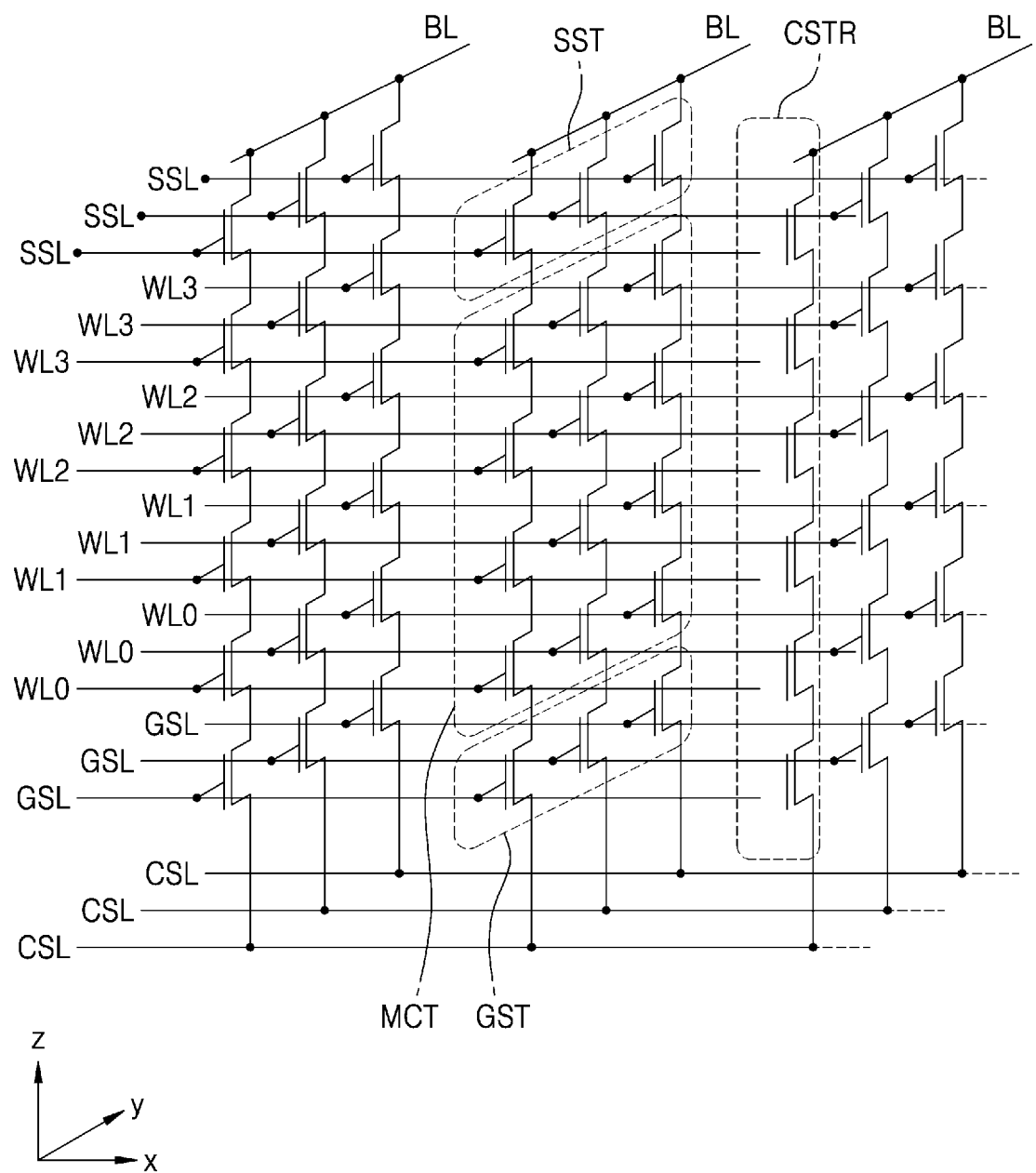
FIG. 1 is a schematic circuit diagram of an array of a conventional three-dimensional (3D) flash memory.
Figure 2:
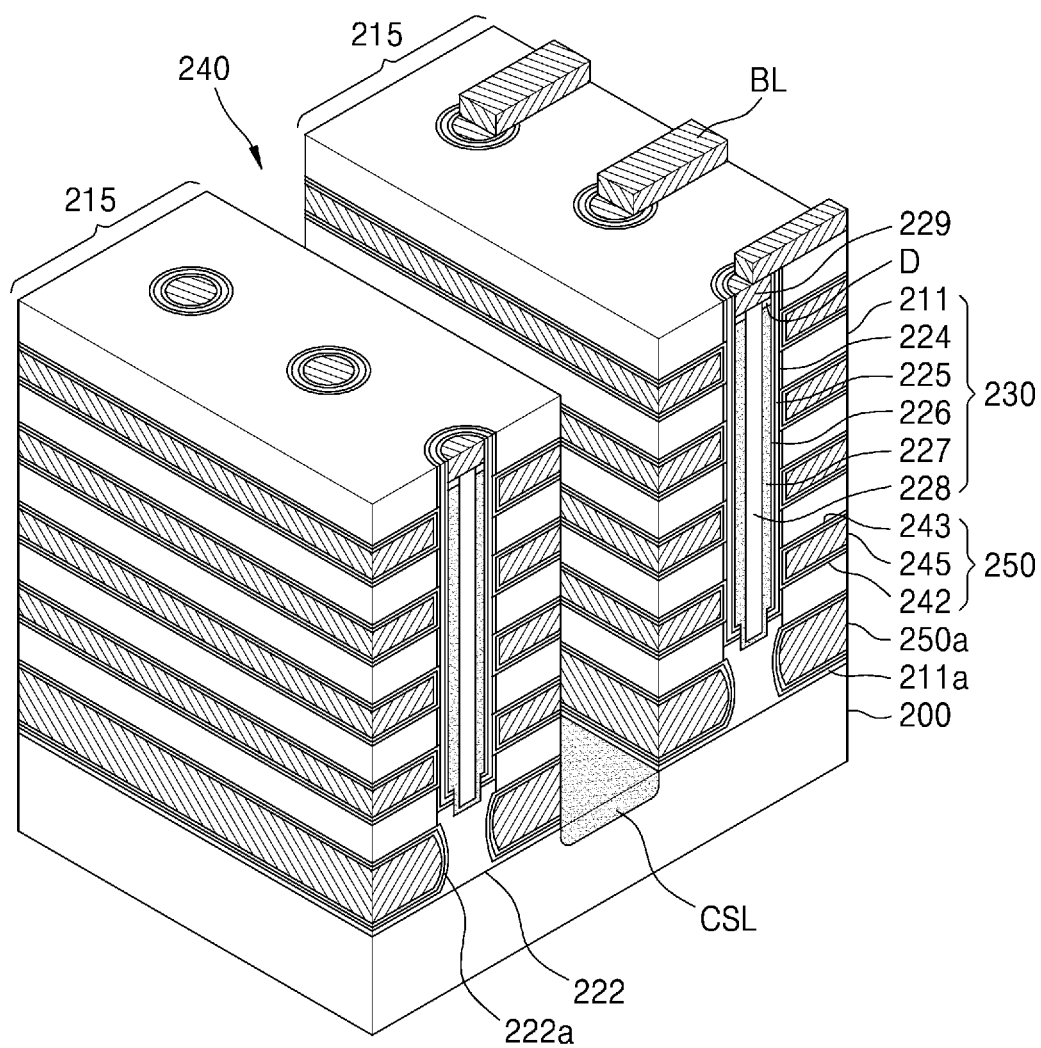
FIG. 2 is a perspective view of a structure of a conventional 3D flash memory.

Hereinafter, embodiments will be described in detail with reference to the accompanying drawings. However, the present disclosure is not limited by the embodiments. In addition, the same reference numerals shown in each drawing refer to the same elements.

Furthermore, the terminology used herein is for the purpose of appropriately describing example embodiments of the present disclosure, and may vary depending on the intention of users or operators or customs in the art to which the present disclosure belongs. Therefore, terms used herein should be defined based on contents of the entire present specification.

Figure 3:
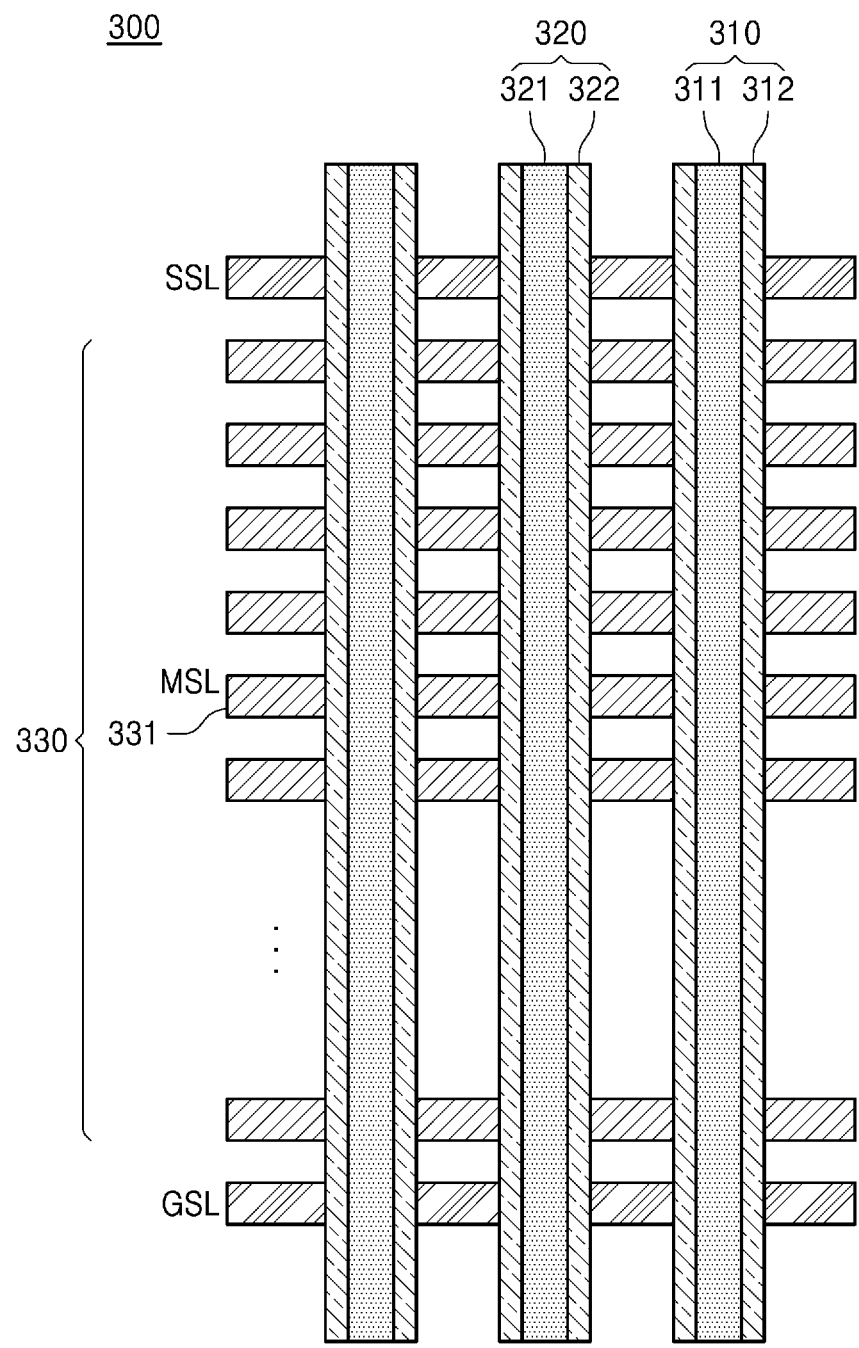
FIG. 3 is a cross-sectional view of a 3D flash memory according to an embodiment.
Figure 4:
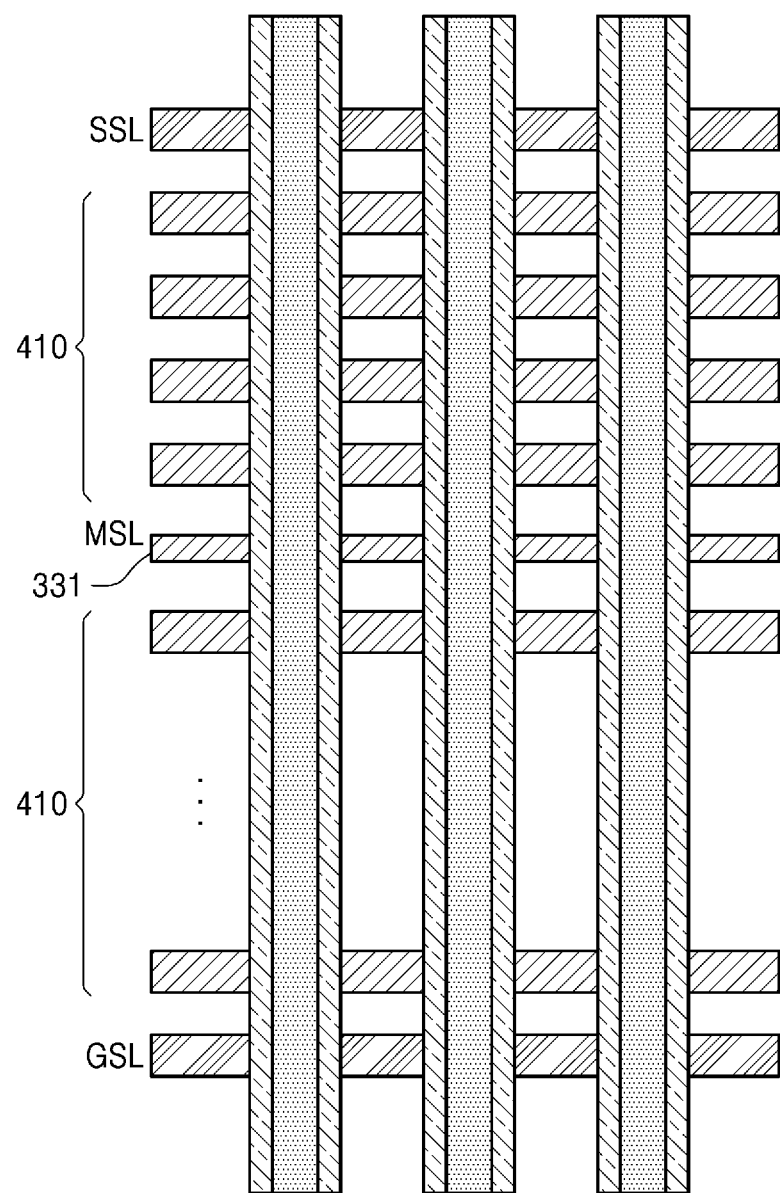
FIGS. 4 and 5 are cross-sectional views of various examples of the 3D flash memory shown in FIG. 3.
Figure 5:
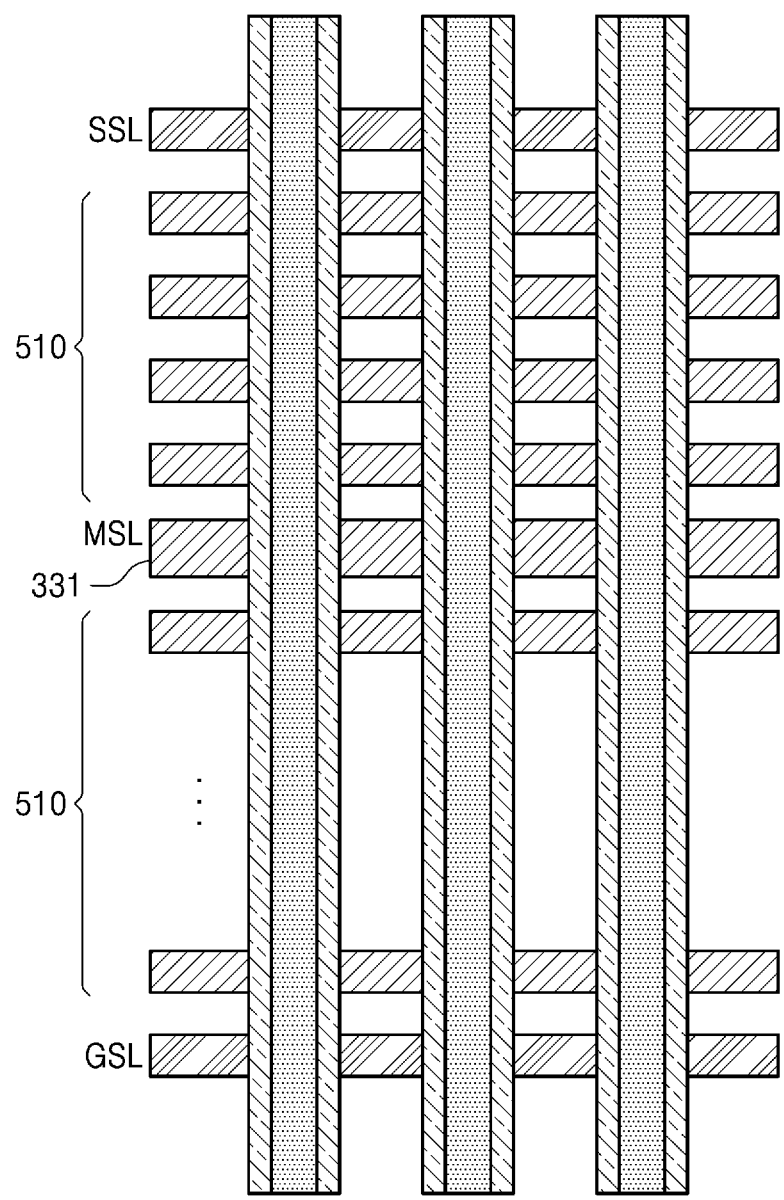

FIG. 3 is a cross-sectional view of a 3D flash memory according to an embodiment, and FIGS. 4 and 5 are cross-sectional views of various examples of a 3D flash memory shown in FIG. 3.

Referring to FIG. 3, a 3D flash memory 300 according to an embodiment may include at least one string (e.g., 310 and 320) formed on a substrate to extend in one direction and a plurality of word lines 330 connected to the strings 310 and 320 in a vertical direction.

The strings 310 and 320 may include channel layers 311 and 321 formed to extend in one direction, and charge storage layers 312 and 322 formed to surround the channel layers 311 and 321. The charge storage layers 312 and 322 may be components configured to store charges due to a voltage applied through the plurality of word lines 330. In the 3D flash memory 300, the charge storage layers 312 and 322 may serve as data storages and have, for example, an oxide-nitride-oxide (ONO) structure. The channel layers 311 and 321 may be formed of single crystalline silicon or polysilicon and each arranged in a hollow tube form. In this case, a buried film (not shown) may be further located to fill the channel layers 311 and 321. Thus, the strings 310 and 320 may include memory cells corresponding respectively to the plurality of word lines 330 connected in the vertical direction.

The plurality of word lines 330 may be formed of a conductive material, such as tungsten (W), titanium (Ti), tantalum (Ta), copper (Cu), or gold (Au) and perform a program operation and an erase operation by applying a voltage to the memory cells respectively corresponding thereto. A plurality of insulating layers (not shown) may be between the plurality of word lines 330.

Here, a string selection line (SSL) may be on the strings 310 and 320 and connected to a bit line, and a ground selection line (GSL) may be under the strings 310 and 320 and connected to a source line. However, the present disclosure is not limited thereto. The SSL may be under the strings 310 and 320, and GSL may be on the strings 310 and 320. That is, in a structure configured to support a bulk-erase scheme, the SSL is fixedly on the strings 310 and 320 and the GSL is fixedly under the strings 310 and 320. However, in a structure configured to support a gate-induced drain leakage (GIDL)-erase scheme, the SSL and the GSL may be adaptively either on or under the strings 310 and 320.

In this case, the 3D flash memory 300 according to the embodiment is characterized in that at least one word line 331 of the plurality of word lines 330 is used as a middle signal line (MSL) configured to apply a signal to reduce a boosting area. More specifically, the at least one word line 331 may be used as an MSL configured to turn off a partial region of the at least one string 10 and perform a program operation on a specific memory cell on the remaining partial region or used as an MSL configured to deplete a partial region of the at least one string 310 and perform an erase operation on a remaining partial region. Naturally, the at least one word line 331 may be used as an MSL configured to perform both the program operation described above and the erase operation described above.

For example, the 3D flash memory 300 may apply an off voltage for turning off a channel (precisely, a channel of a partial region of the at least one string 310) to the MSL 331 and perform a program operation on a specific memory cell on the remaining partial region. In a specific example, the 3D flash memory 300 may turn off the partial region of the at least one string 310, apply a pass voltage to word lines in the remaining partial region, and apply a program voltage to a word line corresponding to the specific memory cell on the remaining partial region, and thus, the 3D flash memory 300 may perform the program operation on the specific memory cell. A detailed description thereof will be presented with reference to FIGS. 6 to 8. Here, the partial region of the at least one string 310 refers to a region between the MSL 331 and the GSL, and the remaining partial region refers to the remaining region excluding a partial region of an entire region of the at least one string 310. For example, the remaining partial region may be a region between the MSL 331 and the SSL excluding the region between the MSL 331 and the GSL, in the entire region of the at least one string 310. Although the structure configured to support the bulk-erase scheme in which positions of the SSL and the GSL are fixed based on the strings 310 and 320 is illustrated, the present disclosure is not limited thereto, and the 3D flash memory may have a structure configured to support a GIDL-erase scheme in which positions of the SSL and the GSL are adaptively changed based on the strings 310 and 320.

In another example, the 3D flash memory 300 may float the MSL 331 and the word lines in the partial region of the at least one string 310 and apply a ground voltage to the word lines in the remaining partial region, and thus, the 3D flash memory 300 may perform an erase operation on the remaining partial region. In a specific example, the 3D flash memory 300 may perform the erase operation on the remaining partial region by applying an erase voltage to a bulk region of the substrate. A detailed description thereof will be presented with reference to FIGS. 9 and 10. In this case, the partial region of the at least one string 310 refers to a region between the MSL 331 and the GSL, and the remaining partial region refers to the remaining region excluding the partial region of the entire region of the at least one string 310. In an example, the remaining partial region may be the region between the MSL 331 and the SSL excluding the region between the MSL 331 and the GSL in the entire region of the at least one string 310.

In yet another example, the 3D flash memory 300 may deplete the partial region of the at least one string 310 by applying a blocking voltage for depleting the channel to the MSL 331, and perform an erase operation on the remaining partial region. In a specific example, the 3D flash memory 300 may apply a ground voltage to word lines in the remaining partial region and apply an erase voltage to the bulk region of the substrate, and thus, the 3D flash memory 300 may perform an erase operation on the remaining partial region. A detailed description thereof will be presented with reference to FIGS. 11 and 12. Here, the partial region of the at least one string 310 refers to a region between the MSL 331 and the SSL, and the remaining partial region refers to a remaining region excluding the partial region of the entire region of the at least one string 310. In an example, the remaining partial region may be the region between the MSL 331 and the GSL excluding the region between the MSL 331 and the SSL, of the entire region of the at least one string 310.

The at least one word line 331 used as the MSL may include a channel region having a different length from a channel region of each of the remaining word lines of the plurality of word lines 330. For example, as shown in FIG. 4, the at least one word line 331 may be formed to a thickness less than a thickness of the remaining word lines 410 such that the at least word line 331 has a length less than a length of each of the remaining word lines 410. In another example, as shown in FIG. 5, the at least one word line 331 may be formed to a thickness greater than the thickness of the remaining word lines 510 such that the at least one word line 331 has a length greater than the thickness of each of the remaining word lines 510.

As described above, the 3D flash memory 300 according to the embodiment may use the at least one word line 331 of the plurality of word lines 330 as an MSL to which a signal is applied to reduce a boosting area, and thus, an area boosted in a conventional 3D flash memory may be significantly reduced. Accordingly, speed may be improved during a program operation, power consumption related to a pass voltage applied to an unselected word line may be reduced, and a bulk potential rise time and a hole injection time may be reduced during an erase operation. Detailed descriptions of the program operation and the erase operation will be described below.

Only one MSL 331 is described as being in a vertical direction to the strings 310 and 320, without being limited thereto, and a plurality of MSLs 331 may be apart from each other in the vertical direction to the strings 310 and 320. In this case, the structure described above and an operation method described below may be applied as they are.

Figure 6:
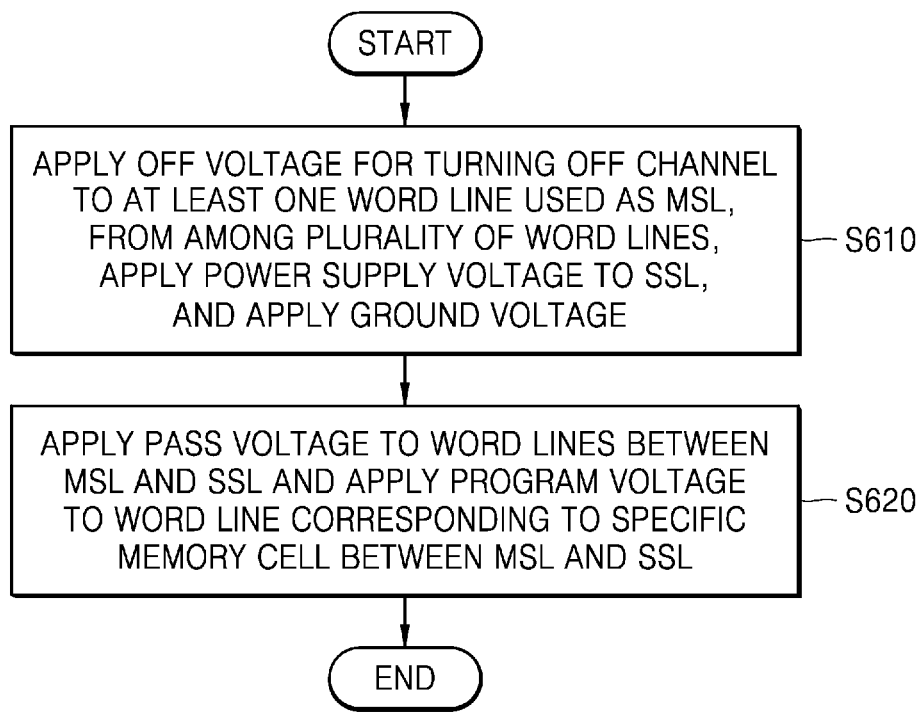
FIG. 6 is a flowchart of a program operation of a 3D flash memory according to an embodiment.
Figure 7:
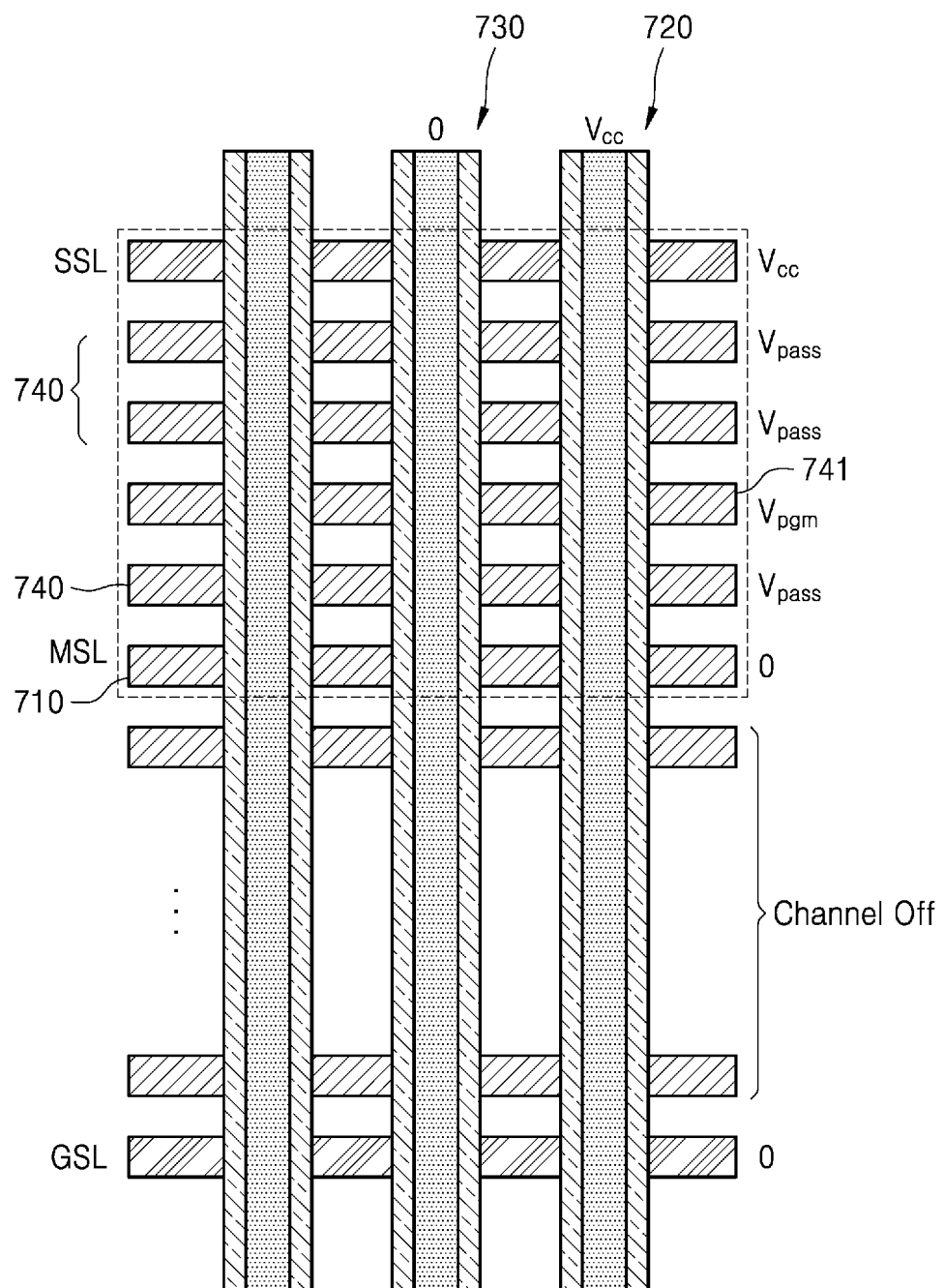
FIGS. 7 and 8 are cross-sectional views for explaining a program operation of a 3D flash memory according to an embodiment.
Figure 8:
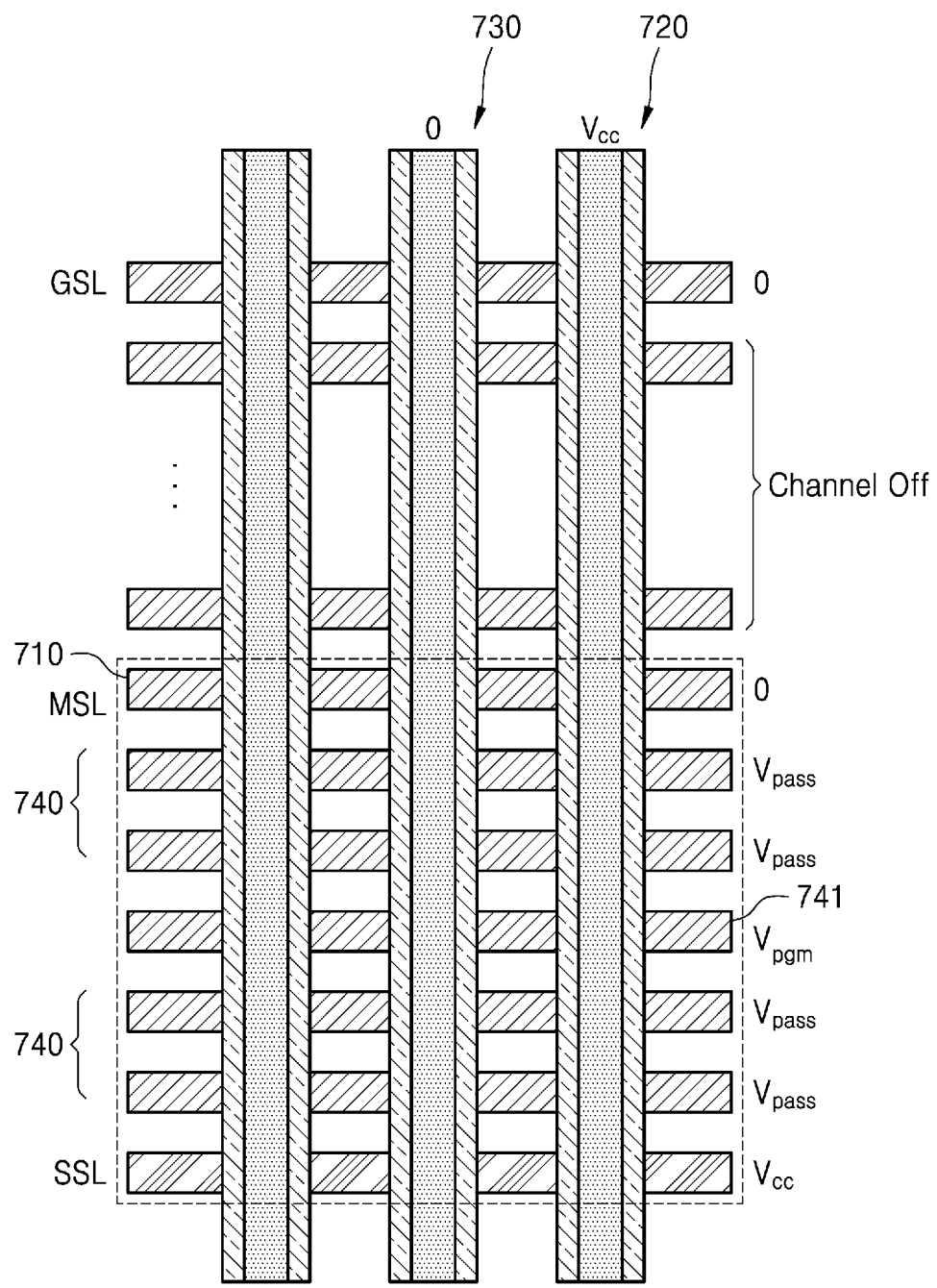

FIG. 6 is a flowchart of a program operation of a 3D flash memory, according to an embodiment, and FIGS. 7 and 8 are cross-sectional views for explaining a program operation of a 3D flash memory, according to an embodiment.

Referring to FIG. 6, in operation S610, the 3D flash memory according to the embodiment applies an off voltage for turning off a channel (precisely, a channel of a partial region of at least one string) to at least one word line 710 used as an MSL, from among a plurality of word lines, applies a power supply voltage to an SSL connected to an upper portion or a lower portion of the at least one string, and applies a ground voltage to a GSL connected to the upper portion of the lower portion of the at least one string. Hereinafter, the off voltage will be described as having a subthreshold voltage of, for example, 0 V, without being limited thereto, and the off voltage may be adjusted to various values capable of turning off the partial region of the at least one string.

For example, as shown in FIG. 7, the 3D flash memory may apply an off voltage of 0 V for turning off a channel of a region between the MSL 710 and the GSL, of an entire region of a string 720 to the MSL 710 and turns off the region between the MSL 710 and the GSL, of the entire region of the string 720. Simultaneously, the 3D flash memory may apply a power supply voltage Vcc to the string 720 including a specific memory cell to be programmed, from among a plurality of strings (e.g., 720 and 730), apply the power supply voltage Vcc to an SSL located in an upper portion of the string 720, and apply a ground voltage of 0 V to a GSL located in a lower portion of the string 720. As a result, because only an upper region (a region between the MSL 710 and the SSL) located above the MSL 710, of the entire region of the string 720, is boosted due to operation S620 described below, unlike an operation of a conventional 3D flash memory in which an entire region of a string is boosted, a boosting area may be markedly reduced (in an example, when the MSL 710 is in a middle region of the string 720, the boosting area is reduced by ½).

The above-described example is a description of a process of performing a program operation on a specific memory cell located above the MSL 710 in both a structure configured to support a GIDL-erase scheme and a structure configured to support a bulk-erase scheme.

In another example, as shown in FIG. 8, the 3D flash memory may apply an off voltage of 0 V for turning off the region between the MSL 710 and the GSL, of the entire region of the string 720, to the MSL 710 and turn off the region between the MSL 710 and the GSL, of the entire region of the string 720. Simultaneously, the 3D flash memory may apply the power supply voltage Vcc to the string 720 including the specific memory cell to be programmed, from among the plurality of strings (e.g., 720 and 730), apply the power supply voltage Vcc to an SSL located in a lower portion of the string 720, and apply a ground voltage of 0 V to a GSL located in an upper portion of the string 720. As a result, because only a lower region (the region between the MSL 710 and the SSL) located below the MSL 710, of the entire region of the string 720, is boosted due to operation S620 described below, unlike the operation of the conventional 3D flash memory in which the entire region of the string is boosted, a boosting area may be markedly reduced (in an example, when the MSL 710 is in the middle region of the string 720, the boosting area is reduced by ½).

The above-described example is a description of a process of performing a program operation on a specific memory cell located below the MSL 710 in the structure configured to support the GIDL-erase scheme.

Thereafter, in operation S620, as shown in FIG. 7 or FIG. 8, the 3D flash memory applies a pass voltage Vpass to word lines 740 between the MSL 710 and the SSL, and applies a program voltage Vpgm to a word line 741 corresponding to a specific memory cell between the MSL 710 and the SSL, and thus, the 3D flash memory performs a program operation on the specific memory cell.

As described above, due to operations S610 and S620, the 3D flash memory according to the embodiment boosts only the region between the MSL 710 and the SSL and performs the program operation on the specific memory cell on the region. Accordingly, the 3D flash memory according to the embodiment may improve the speed of the program operation by reducing the boosting area, and reduce power consumption without applying a pass voltage to word lines included in an unboosted region (the region between the MSL 710 and the GSL).

Figure 9:
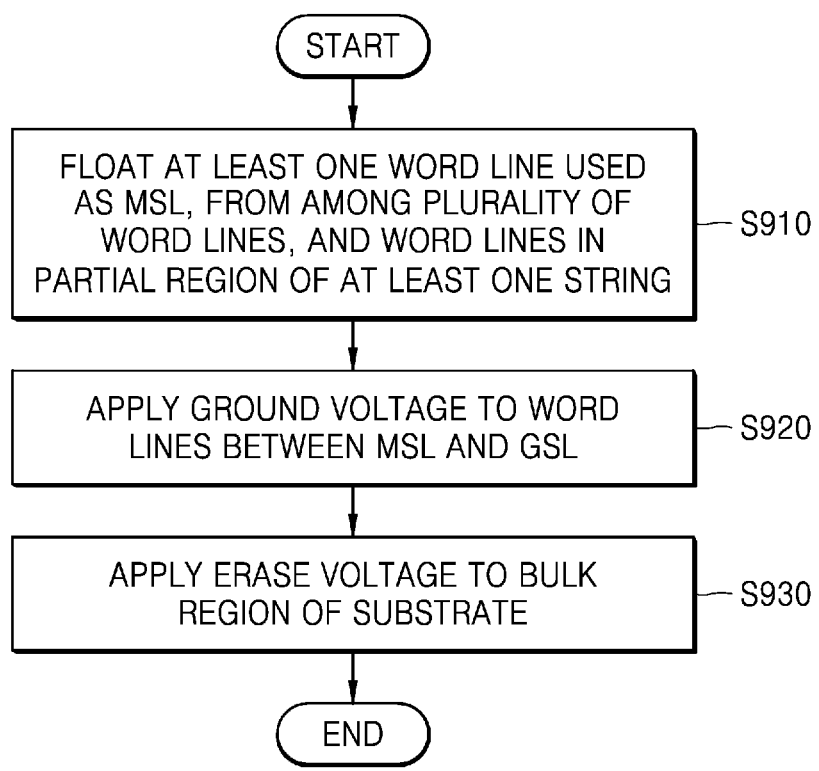
FIG. 9 is a flowchart of an erase operation of a 3D flash memory according to an embodiment.
Figure 10:
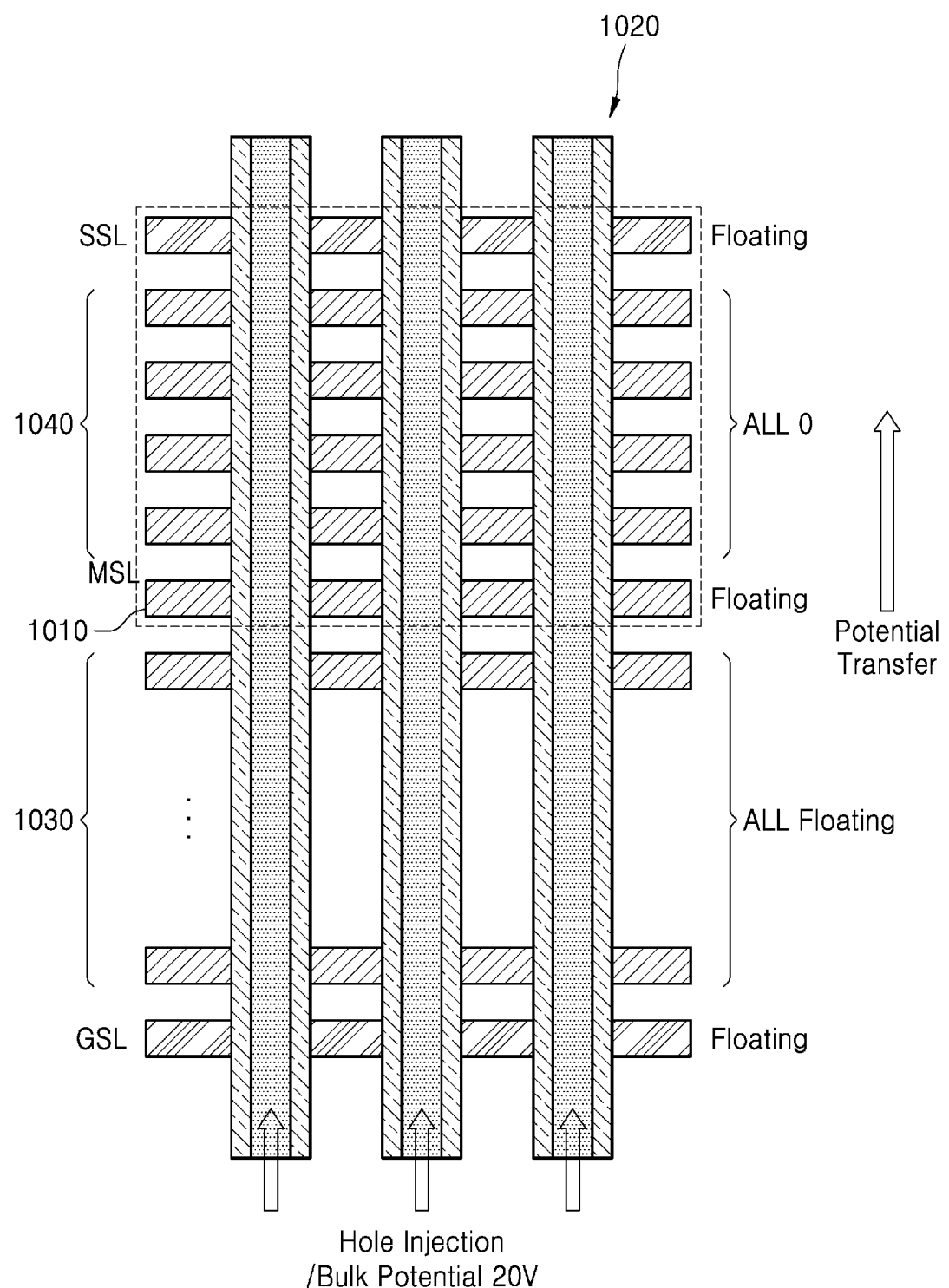
FIG. 10 is a cross-sectional view for explaining an erase operation of a 3D flash memory, according to an embodiment.

FIG. 9 is a flowchart of an erase operation of a 3D flash memory, according to an embodiment, and FIG. 10 is a cross-sectional view for explaining an erase operation of a 3D flash memory, according to an embodiment.

Referring to FIG. 9, in operation S910, the 3D flash memory according to the embodiment may float at least one word line 1010 used as an MSL, from among a plurality of word lines, and word lines in a partial region of at least one string 1020. Hereinafter, the partial region of the at least one string 1020 refers to a region between a GSL connected to a lower portion of the at least one string 1020 and the MSL 1010, of an entire region of the at least one string 1020.

For example, as shown in FIG. 10, the 3D flash memory may float the MSL 1010, word lines 1030 between the MSL 1010 and the GSL, and the GSL.

Next, in operation S920, the 3D flash memory applies a ground voltage of 0 V to word lines 1040 between the MSL 1010 and an SSL connected to an upper portion of the at least one string 1020 as shown in FIG. 10.

Although not shown as a separate operation, the 3D flash memory may float the SSL in operation S910 or operation S920.

As a result, a bulk potential applied from a bulk region of a substrate due to operation S930 described below may pass through the region between the GSL and the MSL 1010 and reach a region between the SSL and the MSL 1010.

Thereafter, the 3D flash memory performs an erase operation on the region between the MSL 1010 and the SSL, of the at least one string 1020, by applying an erase voltage of 20 V to the bulk region of the substrate in operation S930, as shown in FIG. 10. Hereinafter, the erase voltage will be described as 20 V, without being limited thereto, and the erase voltage may be adjusted to various values via which the erase operation may be performed.

As described above, because only an upper region (a region between the MSL 1010 and the SSL) located above the MSL 1010, of the entire region of the at least one string 1020, is boosted, unlike an operation of a conventional 3D flash memory in which an entire region of a string is boosted, a boosting area may be markedly reduced (in an example, when the MSL 1010 is in a middle region of the string 1020, the boosting area is reduced by ½). Accordingly, the 3D flash memory according to the embodiment may reduce a bulk potential rise time and a hole injection time during the erase operation by reducing the boosting area.

Figure 11:
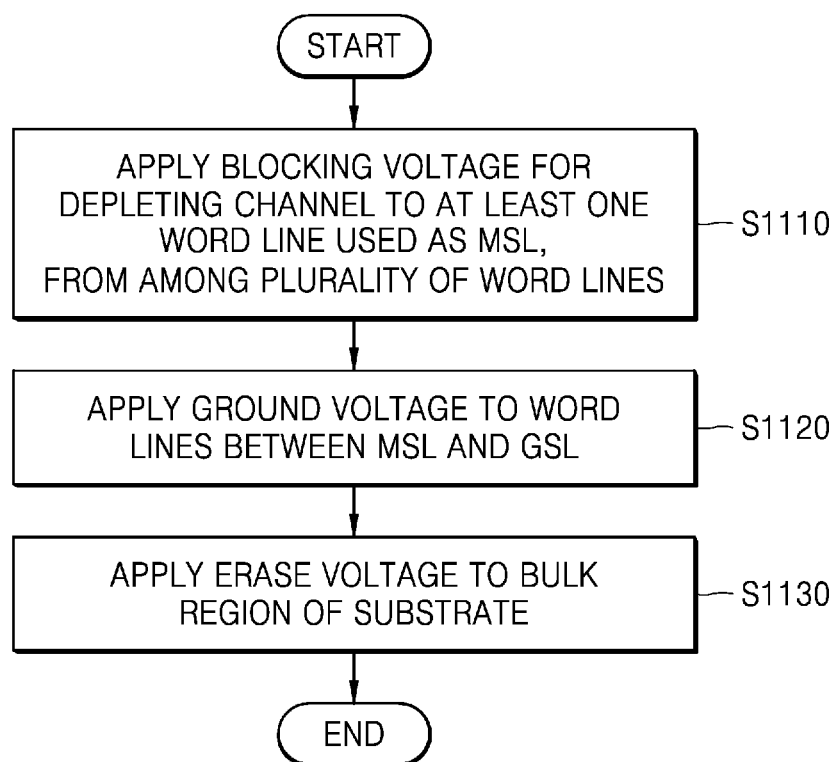
FIG. 11 is a flowchart of an erase operation of a 3D flash memory according to another embodiment.
Figure 12:
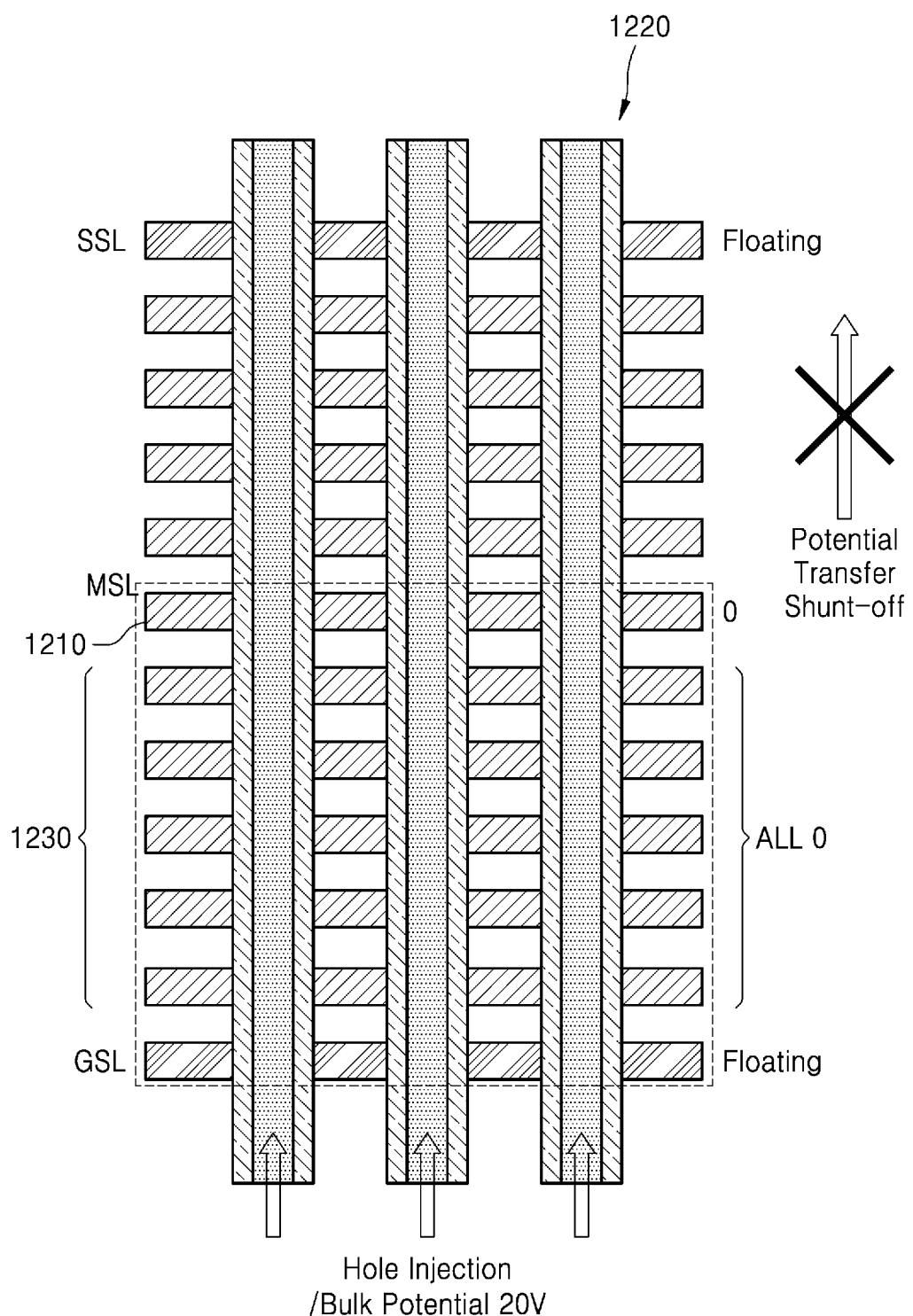
FIG. 12 is a cross-sectional view for explaining an erase operation of a 3D flash memory according to another embodiment.

FIG. 11 is a flowchart of an erase operation of a 3D flash memory, according to another embodiment, and FIG. 12 is a cross-sectional view for explaining an erase operation of a 3D flash memory, according to another embodiment.

Referring to FIG. 11, in operation S1110, a 3D flash memory according to yet another embodiment applies a blocking voltage for depleting a channel to at least one word line 1210 used as an MSL, from among a plurality of word lines. Hereinafter, the blocking voltage will be described as 0 V, without being limited thereto, and the blocking voltage may be adjusted to various values capable of depleting a partial region of at least one string. In addition, hereinafter, a partial region of at least one string 1220 refers to a region between an SSL connected to an upper portion of the at least one string 1220 and the MSL 1210, of an entire region of the at least one string 1220.

Accordingly, a bulk potential applied from a bulk region of a substrate due to operation S1130 described below does not reach the region between the MSL 1210 and the SSL. Because only a lower region (a region between the MSL 1210 and a GSL) located below the MSL 1210, of the entire region of the at least one string 1220, is boosted, unlike an operation of a conventional 3D flash memory in which an entire region of a string is boosted, a boosting area may be markedly reduced, (in an example, when the MSL 1210 is in a middle region of the at least one string 1220, a boosting area is reduced by ½).

Next, in operation S1220, as shown in FIG. 12, the 3D flash memory applies a ground voltage of 0 V to word lines 1230 between a GSL connected to a lower portion of the at least one string 1220 and the MSL 1210.

Although not shown as a separate operation, the 3D flash memory may float the SSL and the GSL in operation S1110 or operation S1120.

Thereafter, the 3D flash memory performs an erase operation on the region between the MSL 1210 and the GSL, of the at least one string 1220, by applying an erase voltage of 20 V to the bulk region of the substrate 1230 in operation S1130 as shown in FIG. 12. Hereinafter, the erase voltage will be described as 20 V, without being limited thereto, and the erase voltage may be adjusted to various values via which the erase operation may be performed.

As described above, the 3D flash memory according to another embodiment may reduce a bulk potential rise time and a hole injection time during the erase operation by reducing the boosting area.

Figure 13:
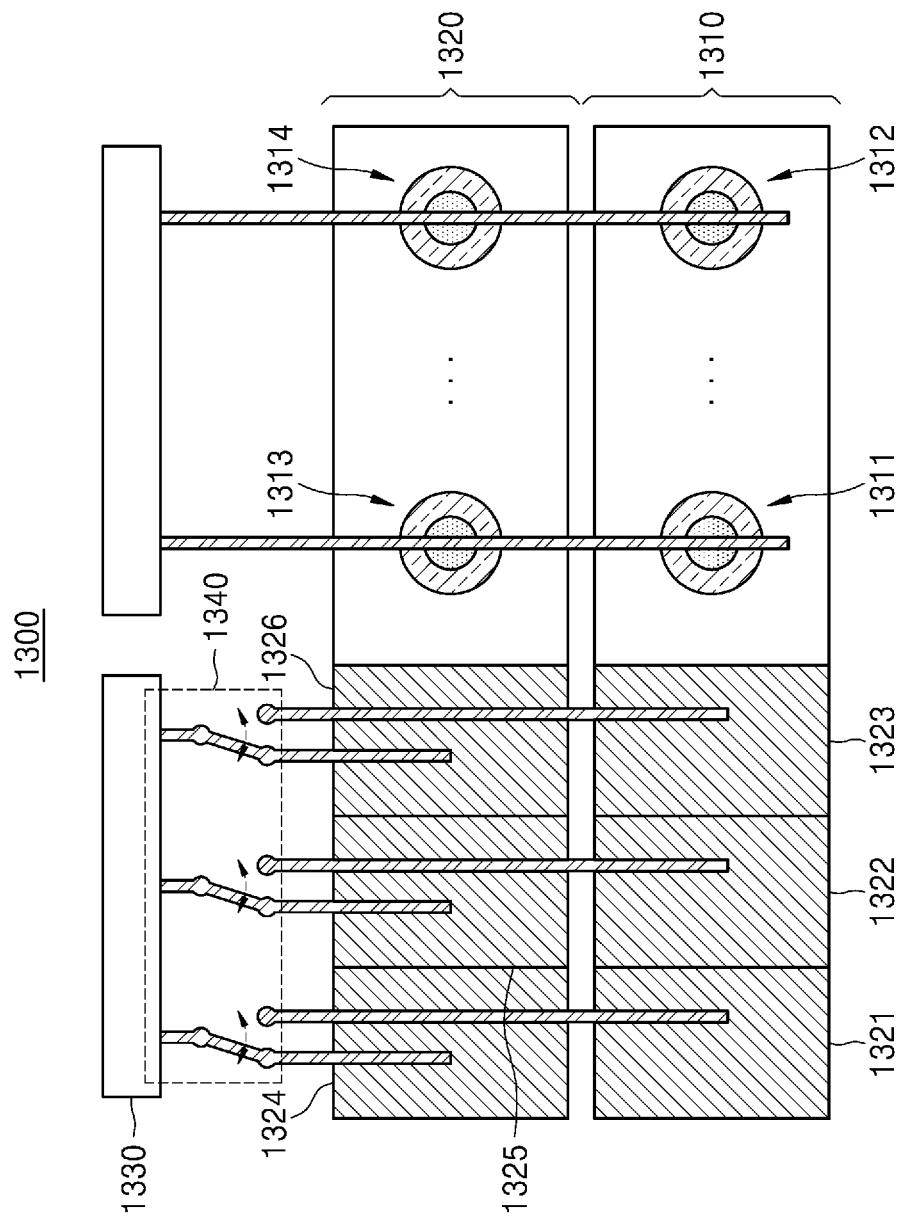
FIG. 13 is a diagram for explaining a 3D flash memory according to an embodiment.

FIG. 13 is a diagram for explaining a 3D flash memory according to an embodiment. Hereinafter, a top view of a top surface of a 3D flash memory 1300 is illustrated in FIG. 13 for brevity.

Referring to FIG. 13, the 3D flash memory 1300 may include a plurality of memory cell strings formed on a substrate to extend in one direction and a plurality of word lines connected to the plurality of memory cell strings in a vertical direction.

As shown in the drawing, each of the plurality of memory cell strings includes a channel layer formed of single crystalline silicon or polysilicon and a charge storage layer, which is a component (e.g., an ONO structure) configured to surround the channel layer and store charges from current supplied through the plurality of word lines.

The plurality of memory cell strings may be grouped to generate small blocks 1310 and 1320. For example, from among the plurality of memory cell strings, a first memory cell string 1311 and a second memory cell string 1312 may be grouped to generate a first small block 1310, and a third memory cell string 1313 and a fourth memory cell string 1314 may be grouped to generate a second small block 1320.

Accordingly, the plurality of word lines may be grouped into a plurality of word line sets to respectively correspond to the small blocks 1310 and 1320. For example, a first word line 1321, a second word line 1322, and a third word line 1323 may be grouped to generate a first word line set corresponding to the first small block 1310, and a fourth word line 1324, a fifth word line 1325, and a sixth word line 1326 may be grouped to generate a second word line set corresponding to the second small block 1320. The plurality of word lines may be formed in a staircase form by using a conductive material, such as tungsten, titanium, tantalum, or the like while alternating with a plurality of insulating layers (not shown).

Accordingly, the 3D flash memory 1300 may independently perform an erase operation on each of the plurality of memory cell strings for each of the small blocks 1310 and 1320. For example, an erase operation on the first memory cell string 1311 and the second memory cell string 1312 and an erase operation on the third memory cell string 1313 and the fourth memory cell string 1314 may be each independently performed. Erase operations on the memory cell strings 1311 and 1312 respectively included in the small blocks 1310 and 1320 may be performed simultaneously. For example, an erase operation on the first memory cell string 1311 and an erase operation on the second memory cell string 1312 may be performed simultaneously, and an erase operation on the third memory cell string 1313 and an erase operation on the fourth memory cell string 1314 may be performed simultaneously.

To this end, the 3D flash memory 1300 may include at least one switching element 1340, which selectively applies a voltage to one word line set of the plurality of word line sets while being connected to a word line wiring 1330 configured to control the plurality of word lines. The at least one switching element 1340 may perform a switching operation of connecting the word line wiring 1330 to any one of the first small block 1310 and the second small block 1320. Thus, the word line wiring 1330 may be connected to the first small block 1310 to apply a voltage to the first word line set corresponding to the first small block 1310 (more precisely, the first word line 1321, the second word line 1322, and the third word line 1323 included in the first word line set), or the word line wiring 1330 may be connected to the second small block 1320 to apply a voltage to the second word line set corresponding to the second small block 1320 (more precisely, the fourth word line 1324, the fifth word line 1325, and the sixth word line 1326 included in the second word line set).

That is, the 3D flash memory 1300 according to the embodiment may perform the erase operation on each of the small blocks 1310 and 1320 by selectively applying the voltage to any one block of the first small block 1310 and the second small block 1320 by using the switching operation of the at least one switching element 1340.

As described above, the at least one switching element 1340 is included in the 3D flash memory 1300, and thus, the word line wiring 1330 does not need to be provided for each word line but is shared between the small blocks 1310 and 1320 (the word line wiring 1330 is shared between word line sets corresponding to the small blocks 1310 and 1320). Accordingly, a disadvantage that a space for arranging word line wirings should be ensured may be solved.

In addition, at least one bit line configured to control the plurality of memory cell strings may be shared between the small blocks 1310 and 1320, and be selectively connected to any one small block of the small blocks 1310 and 1320 by using a plurality of SSLs connected to the at least one bit line (the plurality of SSLs are respectively provided to correspond to the plurality of memory cell strings). That is, the at least one bit line may be connected to any one small block due to a switching operation of the SSL.

Furthermore, the plurality of word lines are formed apart from each other and divided by the plurality of word line sets and, thus, may be controlled for each of the small blocks 1310 and 1320 corresponding respectively to the plurality of word line sets. For example, by forming the first word line set and the second word line set to be separated from each other, the first word line 1321, the second word line 1322, and the third word line 1323 may be separated from the fourth word line 1324, fifth word line 1325, and the sixth word line 1326 and controlled independently.

Although a case in which the small blocks 1310 and 1320 are generated by grouping the plurality of memory cell strings has been described above, the present disclosure is not limited thereto, and small blocks may be generated by grouping vertical-direction memory regions of one memory cell string. A detailed description thereof will be presented with reference to FIG. 14.

Figure 14:
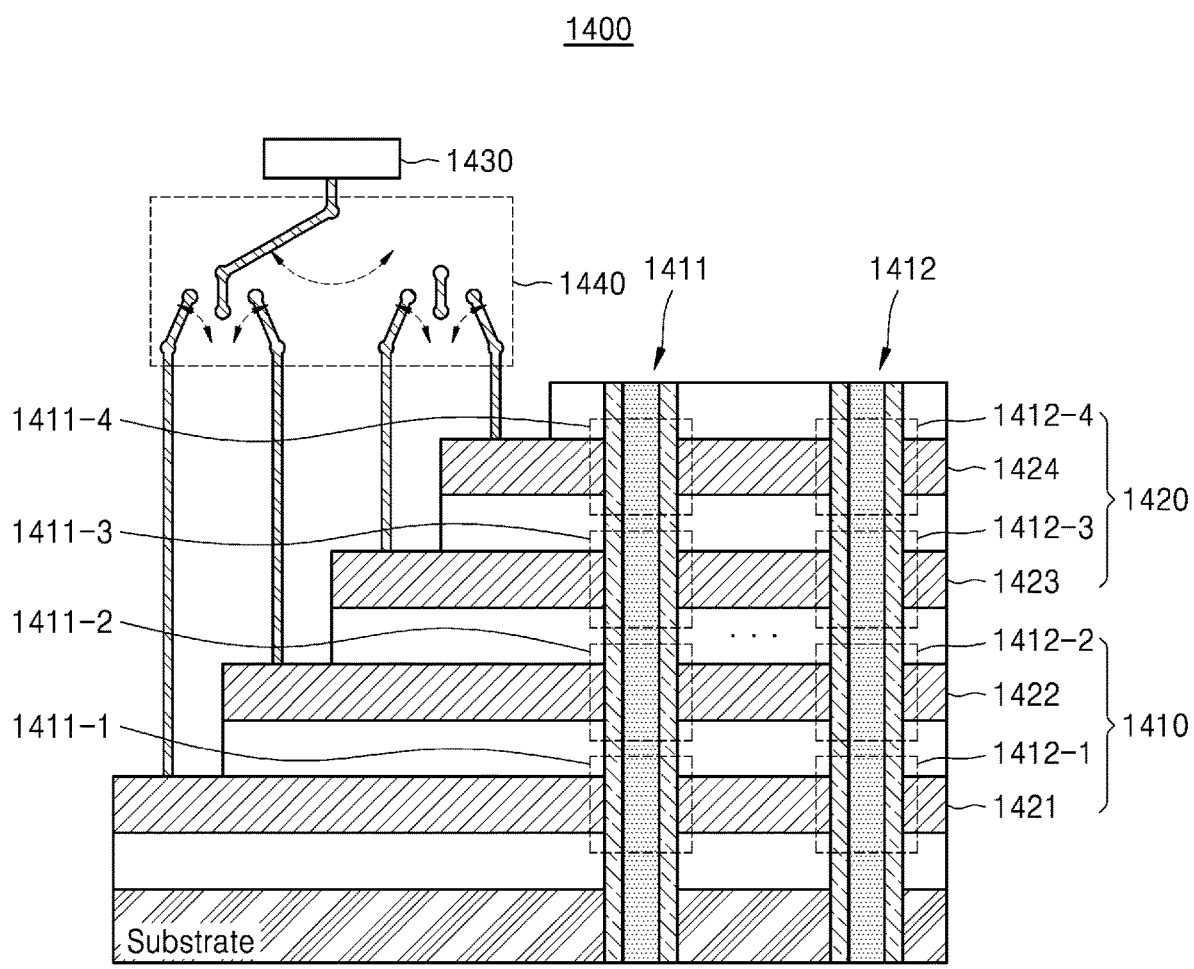
FIG. 14 is a diagram for explaining a 3D flash memory according to another embodiment.

FIG. 14 is a diagram for explaining a 3D flash memory according to another embodiment. Hereinafter, a cross-sectional view showing a cross-section of a 3D flash memory 1400 is illustrated in FIG. 14 for brevity.

Referring to FIG. 14, the 3D flash memory 1400 according to another embodiment includes at least one memory cell string formed to extend on a substrate in one direction and a plurality of word lines connected to the at least one memory cell string in a vertical direction.

As shown in the drawing, each of the at least one memory cell string includes a channel layer formed of single crystalline silicon or polysilicon and a charge storage layer, which is a component (e.g., an ONO structure) configured to surround the channel layer and store charges from current supplied through the plurality of word lines.

Here, the at least one memory cell string may be divided into vertical-direction memory regions 1411-1, 1411-2, 1411-3, 1411-4, 1412-1, 1412-2, 1412-3, and 1412-4 corresponding to the plurality of word lines. For example, the first memory cell string 1411 may form at least one memory cell string by using a first vertical-direction memory region 1411-1 corresponding to a first word line 1421, a second vertical-direction memory region 1411-2 corresponding to a second word line 1422, a third vertical-direction memory region 1411-3 corresponding to a third word line 1423, and a fourth vertical-direction memory region 1411-4 corresponding to a fourth word line 1424. The second memory cell string 1412 may form at least one memory cell string by using a first vertical-direction memory region 1412-1 corresponding to the first word line 1421, a second vertical-direction memory region 1412-2 corresponding to the second word line 1422, a third vertical-direction memory region 1412-3 corresponding to the third word line 1423, and a fourth vertical-direction memory region 1412-4 corresponding to the fourth word line 1424.

The vertical-direction memory regions 1411-1, 1411-2, 1411-3, 1411-4, 1412-1, 1412-2, 1412-3, and 1412-4 may be grouped to generate small blocks 1410 and 1420. For example, the first vertical-direction memory region 1411-1 and the second vertical-direction memory region 1411-2 of the first memory cell string 1411 and the first vertical-direction memory region 1412-1 and the second vertical-direction memory region 1412-2 of the second memory cell string 1412 may be grouped to generate a first small block 1410. The third vertical-direction memory region 1411-3 and the fourth vertical-direction memory region 1411-4 of the first memory cell string 1411 and the third vertical-direction memory region 1412-3 and the fourth vertical-direction memory region 1412-4 of the second memory cell string 1412 may be grouped to generate a second small block 1420.

Accordingly, the plurality of word lines may respectively correspond to the small blocks 1410 and 1420 and be grouped into a plurality of word line sets. For example, the first word line 1421 and the second word line 1422 may be grouped to a first word line set corresponding to the first small block 1410, and the third word line 1423 and the fourth word line 1424 may be grouped to generate a second word line set corresponding to the second small block 1420. The plurality of word lines may be formed in a staircase form by using a conductive material, such as tungsten, titanium, tantalum, or the like, while alternating with a plurality of insulating layers (not shown).

Accordingly, the 3D flash memory 1400 may independently perform an erase operation on each of the vertical-direction memory regions 1411-1, 1411-2, 1411-3, 1411-4, 1412-1, 1412-2, 1412-3, and 1412-4 of the at least one memory cell string for each of the small blocks 1410 and 1420. For example, erase operations on the first vertical-direction memory regions 1411-1 and 1412-1 and the second vertical-direction memory regions 1411-2 and 1412-2 respectively included in the first memory cell string 1411 and the second memory cell string 1412 and erase operations on the third vertical-direction memory regions 1411-3 and 1412-3 and the fourth vertical-direction memory regions 1411-4 and 1412-4 respectively included in the first memory cell string 1411 and the second memory cell string 1412 may be each independently performed. Erase operations on the vertical-direction memory regions 1411-1, 1411-2, 1411-3, 1411-4, 1412-1, 1412-2, 1412-3, and 1412-4 respectively included in the small blocks 1410 and 1420 may be simultaneously performed. For example, the erase operation on the first vertical-direction memory region 1411-1 of the first memory cell string 1411 may be performed simultaneously with the erase operation on the second vertical-direction memory region 1411-2 thereof, and the erase operation on the first vertical-direction memory region 1411-1 of the first memory cell string 1411 may be performed simultaneously with the erase operation on the first vertical-direction memory region 1412-1 of the second memory cell string 1412.

To this end, the 3D flash memory 1400 may include at least one switching element 1440, which selectively applies a voltage to one word line set of the plurality of word line sets while being connected to a word line wiring 1430 configured to control the plurality of word lines. The at least one switching element 1440 may perform a switching operation of connecting the word line wiring 1430 to any one of the first small block 1410 and the second small block 1420. Thus, the word line wiring 1430 may be connected to the first small block 1410 to apply a voltage to the first word line set corresponding to the first small block 1410 (more precisely, the first word line 1421 and the second word line 1422 included in the first word line set), or the word line wiring 1430 may be connected to the second small block 1420 to apply a voltage to the second word line set corresponding to the second small block 1420 (more precisely, the third word line 1423 and the fourth word line 1424 included in the second word line set).

That is, the 3D flash memory 1400 according to the embodiment may perform the erase operation on each of the small blocks 1410 and 1420 by selectively applying the voltage to any one block of the first small block 1410 and the second small block 1420 by using the switching operation of the at least one switching element 1440.

As described above, the at least one switching element 1440 is included in the 3D flash memory 1400, and thus, the word line wiring 1430 does not need to be provided for each word line but is shared between the small blocks 1410 and 1420 (the word line wiring 1430 is shared between word line sets corresponding to the small blocks 1410 and 1420). Accordingly, a disadvantage that a space for arranging word line wirings should be ensured may be solved.

Although a case in which the small blocks 1410 and 1420 are generated by grouping the vertical-direction memory regions 1411-1, 1411-2, 1411-3, 1411-4, 1412-1, 1412-2, 1412-3, and 1412-4 of the at least one memory cell string has been described above, a structure obtained based on a mixture of the above-described case and the case in which the small blocks described above with reference to FIG. 3 are generated by grouping the plurality of memory cell strings may be applied. A detailed description thereof will be presented with reference to FIGS. 15A to 15C.

Figure 15A:
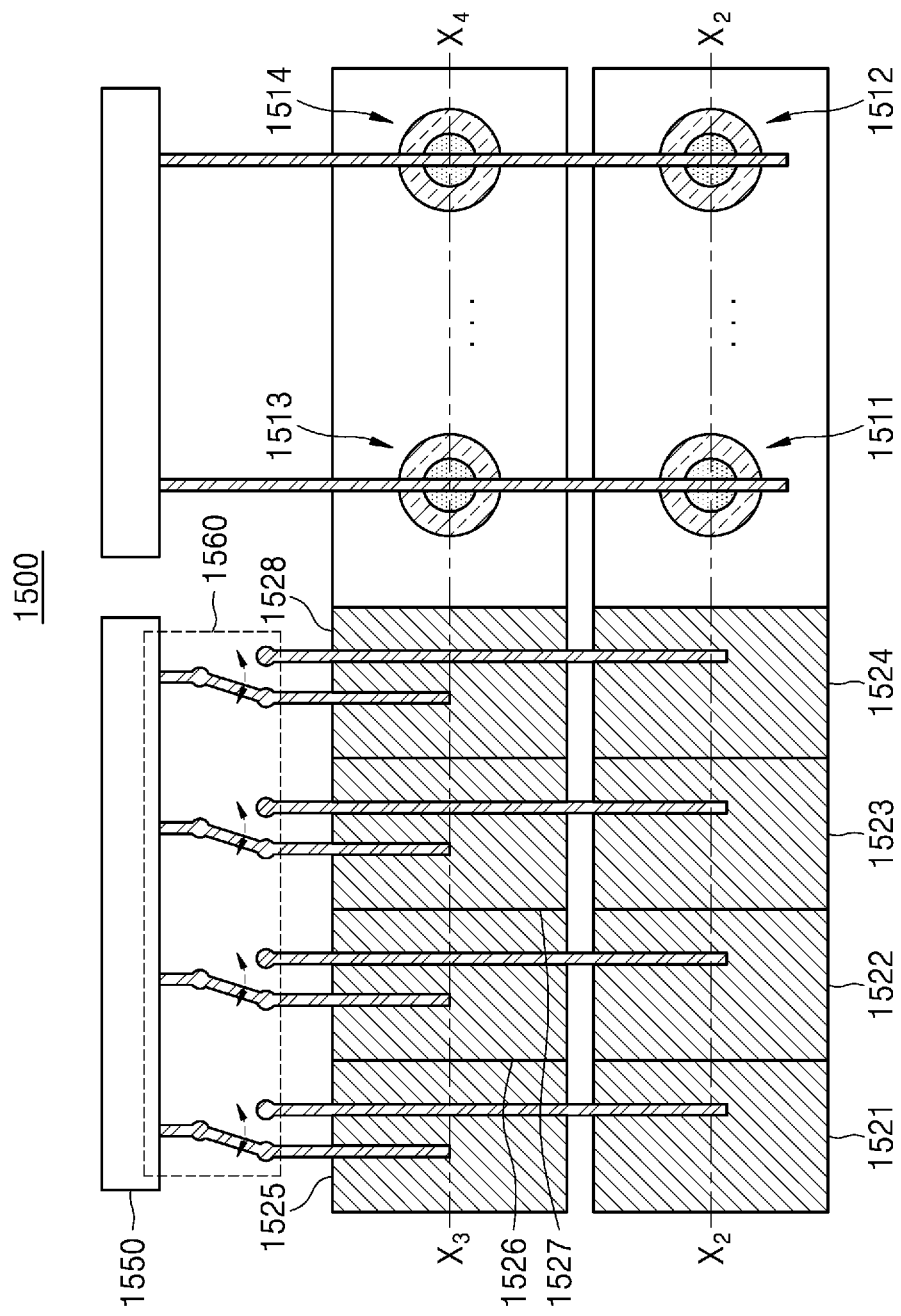
FIGS. 15A to 15C are diagrams for explaining a 3D flash memory according to yet another embodiment.
Figure 15B:
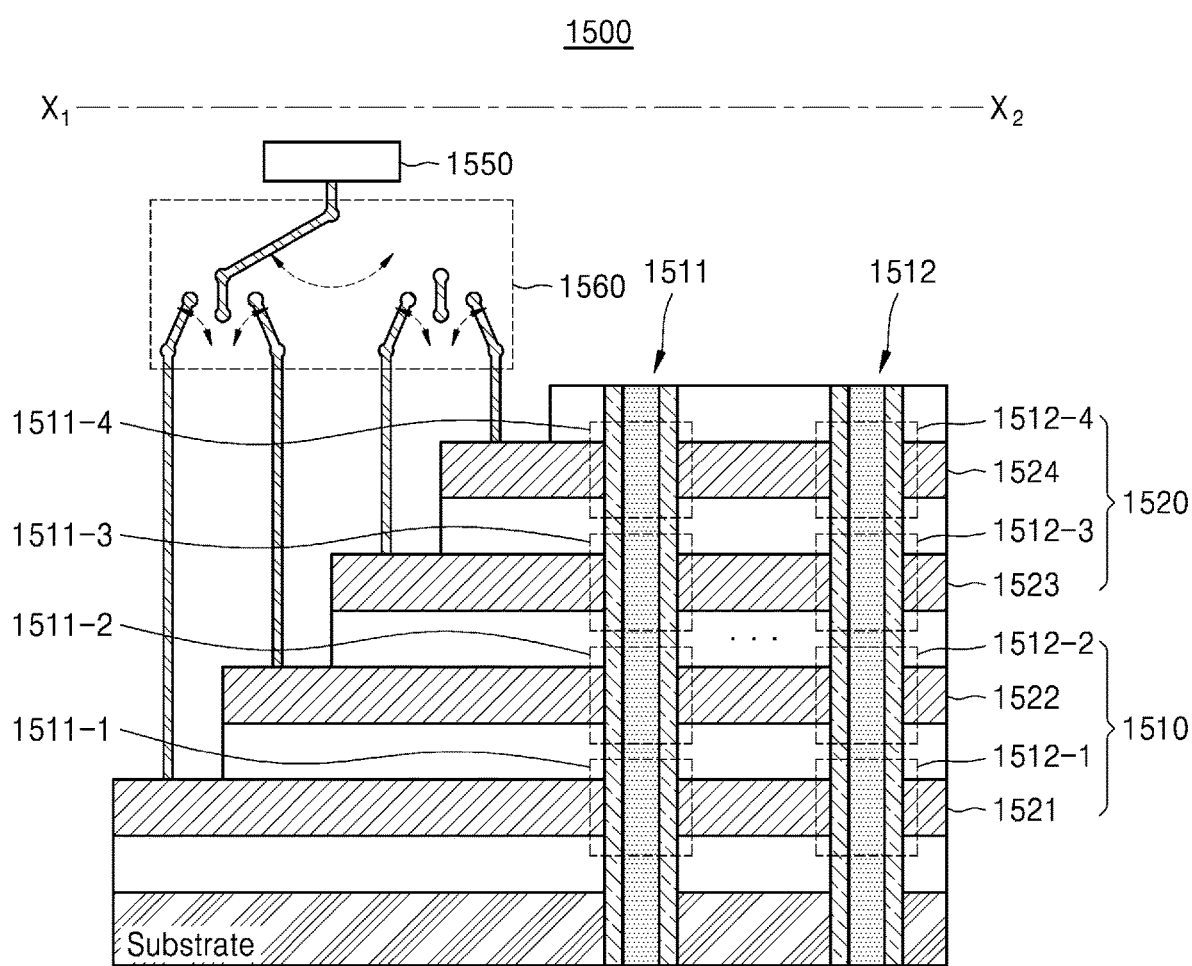
Figure 15C:
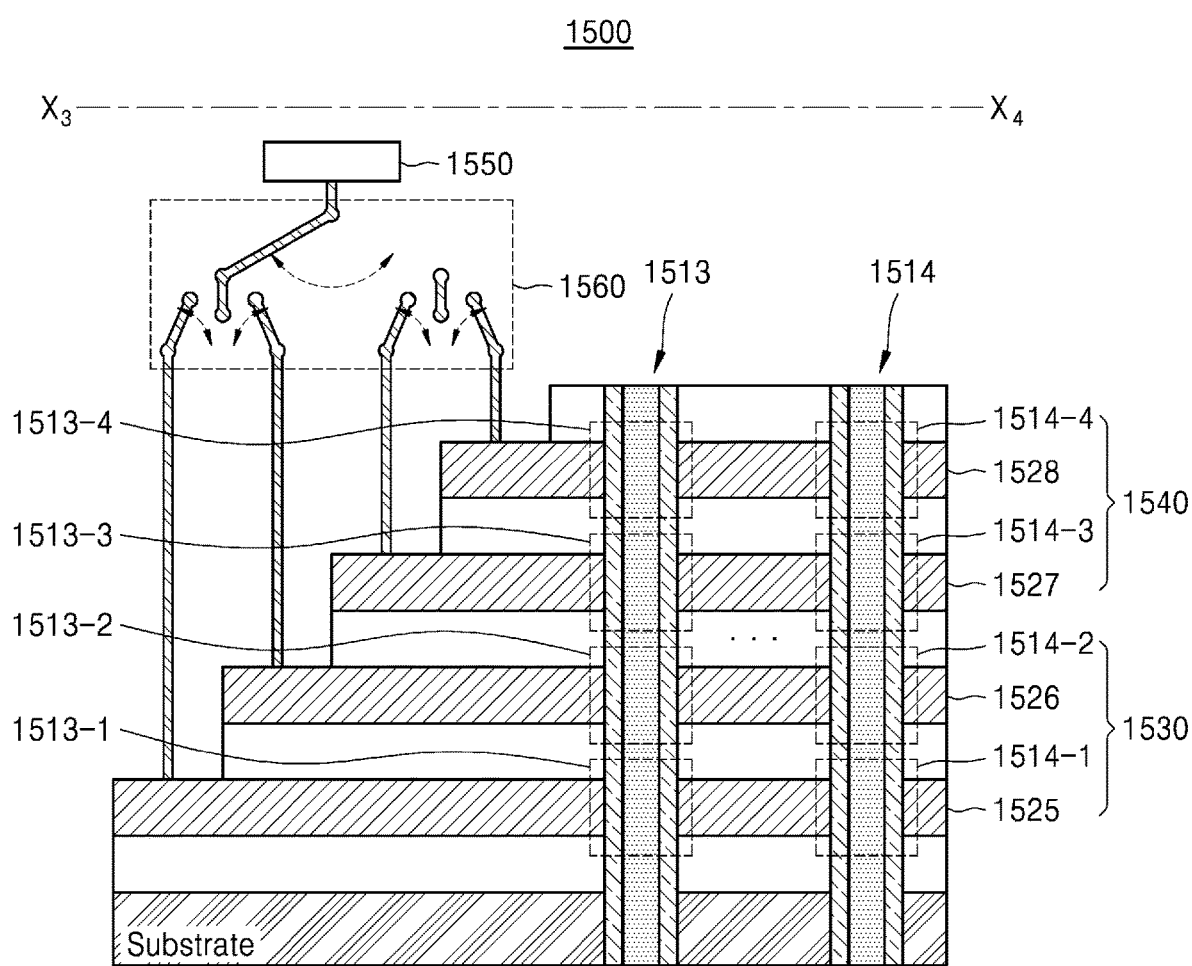
Figure 16:
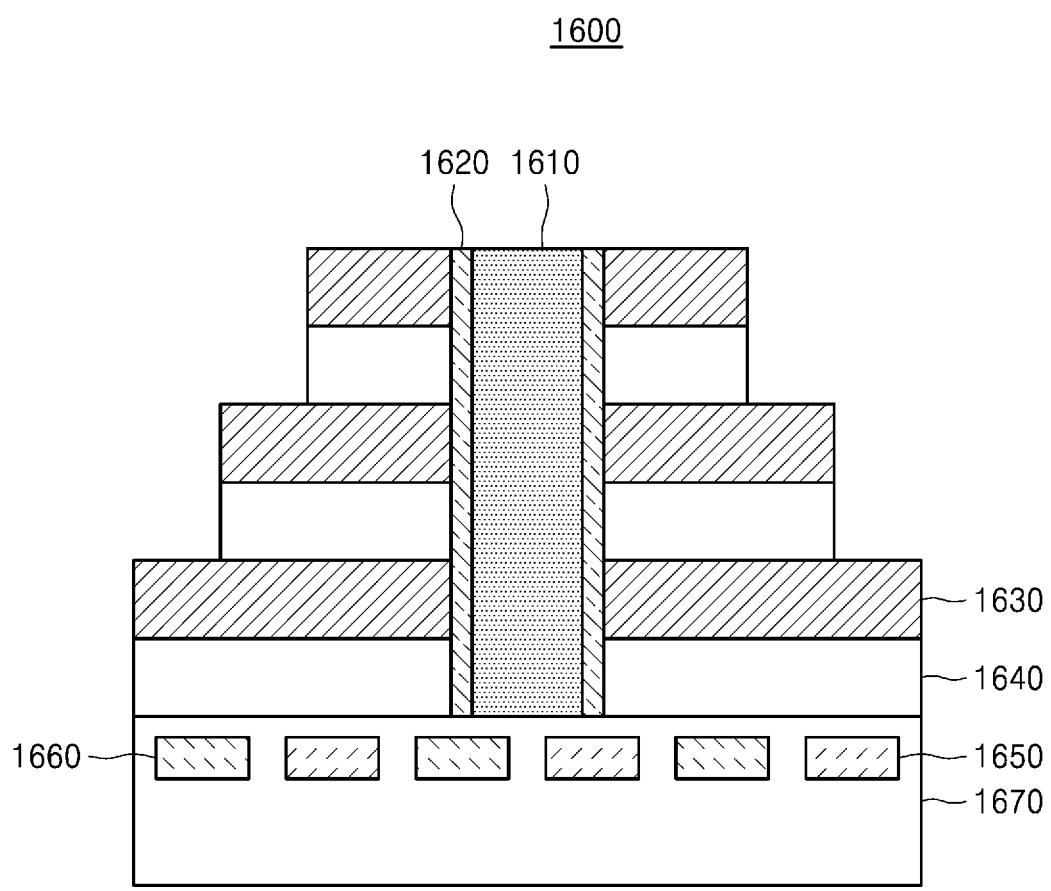
FIG. 16 is a diagram of a conventional 3D flash memory.

FIGS. 15A to 15C are diagrams for explaining a 3D flash memory according to yet another embodiment. Hereinafter, a top view of a top surface of a 3D flash memory 1400 is illustrated in FIG. 15A for brevity, and cross-sectional views of cross-sections of a 3D flash memory 1500 are illustrated in FIGS. 15B and 15C for brevity.

Referring to FIGS. 15A to 15C, the 3D flash memory 1500 according to yet another embodiment may include a plurality of memory cell strings formed on a substrate to extend in one direction and a plurality of word lines connected to the plurality of memory cell strings in a vertical direction.

As shown in the drawing, each of the plurality of memory cell strings includes a channel layer formed of single crystalline silicon or polysilicon and a charge storage layer, which is a component (e.g., an ONO structure) configured to surround the channel layer and store charges from current supplied through the plurality of word lines.

Here, the plurality of memory cell strings may be divided into vertical-direction memory regions 1511-1, 1511-2, 1511-3, 1511-4, 1512-1, 1512-2, 1512-3, 1512-4, 1513-1, 1513-2, 1513-3, 1513-4, 1514-1, 1514-2, 1514-3, and 1514-4 corresponding respectively to the plurality of word lines. For example, from among the plurality of memory cell strings, a first memory cell string 1511 may include a first vertical-direction memory region 1511-1 corresponding to a first word line 1521, a second vertical-direction memory region 1511-2 corresponding to a second word line 1522, a third vertical-direction memory region 1511-3 corresponding to a third word line 1523, and a fourth vertical-direction memory region 1511-4 corresponding to a fourth word line 1524, and a second memory cell string 1512 may include a first vertical-direction memory region 1512-1 corresponding to the first word line 1521, a second vertical-direction memory region 1512-2 corresponding to the second word line 1522, a third vertical-direction memory region 1512-3 corresponding to the third word line 1523, and a fourth vertical-direction memory region 1512-4 corresponding to the fourth word line 1524. A third memory cell string 1513 may include a first vertical-direction memory region 1513-1 corresponding to a fifth word line 1525, a second vertical-direction memory region 1513-2 corresponding to a sixth word line 1526, a third vertical-direction memory region 1513-3 corresponding to a seventh word line 1527, and a fourth vertical-direction memory region 1513-4 corresponding to an eighth word line 1528, and a fourth memory cell string 1514 may include a first vertical-direction memory region 1514-1 corresponding to the fifth word line 1525, a second vertical-direction memory region 1514-2 corresponding to the sixth word line 1526, a third vertical-direction memory region 1514-3 corresponding to the seventh word line 1527, and a fourth vertical-direction memory region 1514-4 corresponding to the eighth word line 1528.

The vertical-direction memory regions 1511-1, 1511-2, 1511-3, 1511-4, 1512-1, 1512-2, 1512-3, 1512-4, 1513-1, 1513-2, 1513-3, 513-4, 1514-1, 1514-2, 1514-3, and 1514-4 may be grouped to generate small blocks 1510, 1520, 1530, and 1540. For example, the first vertical-direction memory region 1511-1 and the second vertical-direction memory region 1511-2 of the first memory cell string 1511 and the first vertical-direction memory region 1512-1 and the second vertical-direction memory region 1512-2 of the second memory cell string 1512 may be grouped to generate a first small block 1510. The third vertical-direction memory region 1511-3 and the fourth vertical-direction memory region 1511-4 of the first memory cell string 1511 and the third vertical-direction memory region 1512-3 and the fourth vertical-direction memory region 1512-4 of the second memory cell string 1512 may be grouped to generate a second small block 1520. The first vertical-direction memory region 1513-1 and the second vertical-direction memory region 1513-2 of the third memory cell string 1513 and the first vertical-direction memory region 1514-1 and the second vertical-direction memory region 1514-2 of the fourth memory cell string 1514 may be grouped to generate a third small block 1530. The third vertical-direction memory region 1513-3 and the fourth vertical-direction memory region 1513-4 of the third memory cell string 1513 and the third vertical-direction memory region 1514-3 and the fourth vertical-direction memory region 1514-4 of the fourth memory cell string 1514 may be grouped to generate a fourth small block 1540.

Accordingly, the plurality of word lines may respectively correspond to the small blocks 1510, 1520, 1530, and 1540 and be grouped into a plurality of word line sets. For example, the first word line 1521 and the second word line 1522 may be grouped to generate a first word line set corresponding to the first small block 1510, and the third word line 1523 and the fourth word line 1524 may be grouped to generate a second word line corresponding to the second small block 1520. The fifth word line 1525 and the sixth word line 1526 may be grouped to generate a third word line set corresponding to the third small block 1530, and the seventh word line 1527 and the eighth word line 1528 may be grouped to generate a fourth word line set corresponding to the fourth small block 1540. The plurality of word lines may be formed in a staircase form by using a conductive material, such as tungsten, titanium, tantalum, or the like, while alternating with a plurality of insulating layers (not shown).

Accordingly, the 3D flash memory 1500 may independently perform an erase operation on each of the vertical-direction memory regions 1511-1, 1511-2, 1511-3, 1511-4, 1512-1, 1512-2, 1512-3, 1512-4, 1513-1, 1513-2, 1513-3, 1513-4, 1514-1, 1514-2, 1514-3, and 1514-4 of the plurality of memory cell strings for each of the small blocks 1510, 1520, 1530, and 1540. For example, an erase operation on the first vertical-direction memory region 1511-1 and the second vertical-direction memory region 1511-2 of the first memory cell string 1511 and an erase operation on the third vertical-direction memory region 1511-3 and the fourth vertical-direction memory region 1511-4 of the first memory cell string 1511 may be independently performed. Erase operations on the vertical-direction memory regions 1511-1, 1511-2, 1512-1, and 1512-2 respectively included in the small blocks 1510, 1520, 1530, and 1540 may be performed simultaneously. For example, an erase operation on the first vertical-direction memory region 1511-1 and the second vertical-direction memory region 1511-2 of the first memory cell string 1511 may be performed simultaneously with an erase operation on the first vertical-direction memory region 1512-1 and the second vertical-direction memory region 1512-2 of the second memory cell string 1512.

To this end, the 3D flash memory 1500 may include at least one switching element 1560, which may selectively apply a voltage to one of the plurality of word line sets while being connected to a word line wiring 1550 configured to control the plurality of word lines. The at least one switching element 1560 may perform a switching operation of connecting the word line wiring 1550 to any one of the first small block 1510, the second small block 1520, the third small block 1530, and the fourth small block 1540. Thus, the word line wiring 1550 may be connected to the first small block 1510 to apply a voltage to the first word line set corresponding to the first small block 1510 (more precisely, the first word line 1521 and the second word line 1522 included in the first word line set), the word line wiring 1550 may be connected to the second small block 1520 to apply a voltage to the second word line set corresponding to the second small block 1520 (more precisely, the third word line 1523 and the fourth word line 1524 included in the second word line set), the word line wiring 1550 may be connected to the third small block 1530 to apply a voltage to the third word line set corresponding to the third small block 1530 (more precisely, the fifth word line 1525 and the sixth word line 1526 included in the third word line set), or the word line wiring 1550 may be connected to the fourth small block 1540 to apply a voltage to the fourth word line set corresponding to the fourth small block 1540 (more precisely, the seventh word line 1527 and the eighth word line 1528 included in the fourth word line set).

That is, the 3D flash memory 1500 according to the embodiment may perform the erase operation on each of the small blocks 1510, 1520, 1530, and 1540 by selectively applying the voltage to any one block of the first small block 1510, the second small block 1520, the third small block 1530, and the fourth small block 1540 by using the switching operation of the at least one switching element 1560.

As described above, because the at least one switching element 1560 is included in the 3D flash memory 1500, the word line wiring 1550 does not need to be provided for each word line but is shared among the small blocks 1510, 1520, 1530, and 1540 (the word line wiring 1550 is shared between word line sets corresponding to the small blocks 1510, 1520, 1530, and 1540). Accordingly, a disadvantage that a space for arranging word line wirings should be ensured may be solved.

Figure 17:
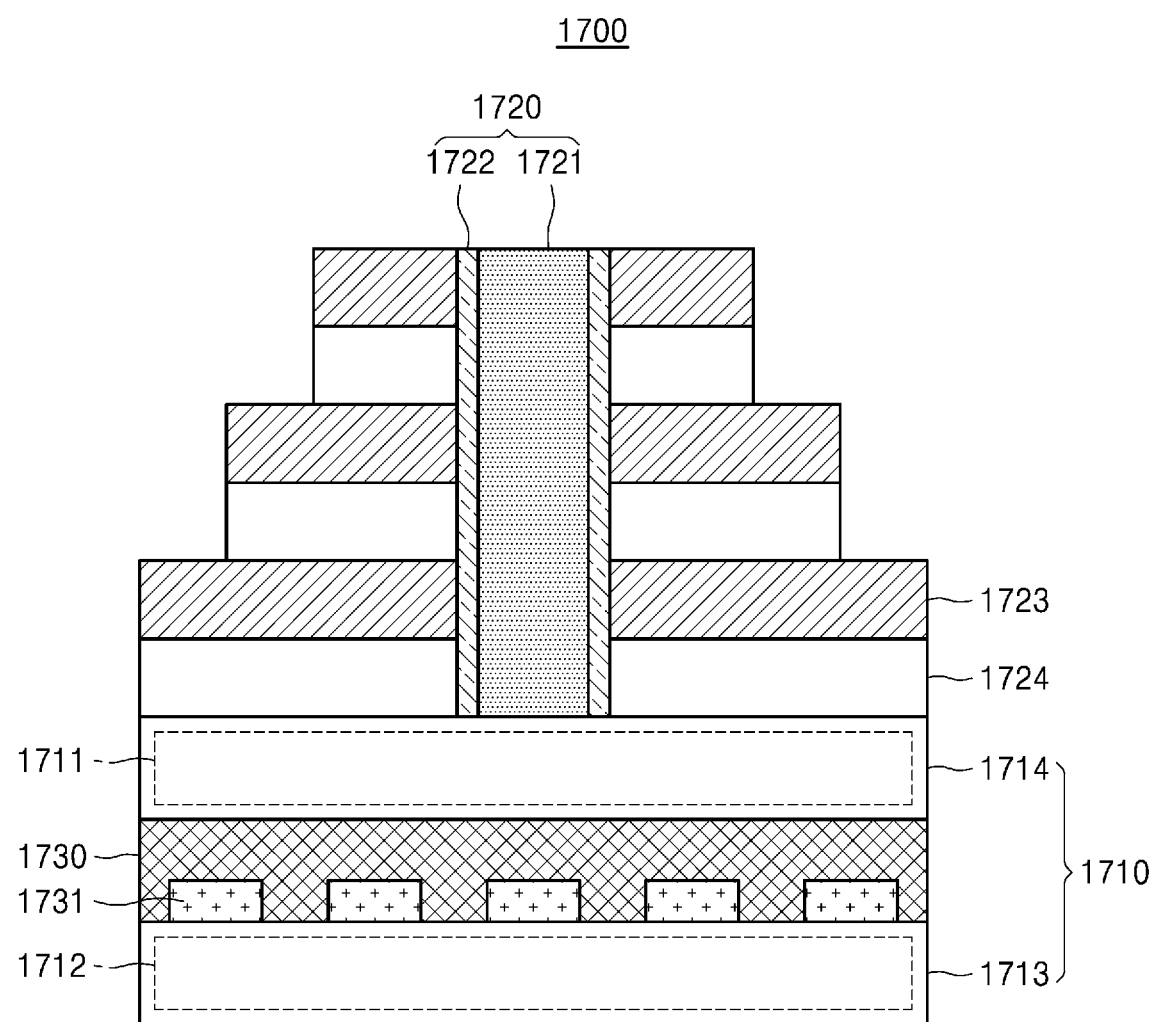
FIG. 17 is a vertical cross-sectional view of a 3D flash memory according to an embodiment.

FIG. 17 is a vertical cross-sectional view of a 3D flash memory according to an embodiment.

Referring to FIG. 17, a 3D flash memory 1700 according to an embodiment includes a substrate 1710 and at least one memory cell string 1720.

Here, the at least one memory cell string 1720 may include at least one channel layer 1721 formed on the substrate 1710 to extend in one direction, and at least one charge storage layer 1722 surrounding the at least one channel layer 1721. The at least one channel layer 1721 may be formed of single crystalline silicon or polysilicon and may be formed using a selective epitaxial growth process or a phase-transition epitaxial process using the substrate 1710 as a seed. The at least one charge storage layer 1722 may be a component configured to store charges from current supplied through a plurality of electrode layers 1723. In an example, the at least one charge storage layer 1722 may have an ONO structure. Hereinafter, the at least one charge storage layer 1722 will be described as including only a vertical element extending in one direction orthogonal to the substrate 1710, without being limited thereto. The at least one charge storage layer 1722 may further include a horizontal element in contact with the plurality of electrode layers 1723 parallel to the plurality of electrode layers 1723.

In this case, the plurality of electrode layers 1723 and a plurality of insulating layers 1724 may be alternately connected to the at least one memory cell string 1720 in a vertical direction, and a drain line (not shown) may be arranged on and connected to the plurality of electrode layers 1723 and a plurality of insulating layers 1724. The plurality of electrode layers 1723 may be formed of a conductive material, such as tungsten, titanium, tantalum, or the like, and the plurality of insulating layers 1724 may be formed of various materials having insulating characteristics.

The above-described structures of the at least one memory cell string 1720, the plurality of electrode layers 1723, and the plurality of insulating layers 1724 are the same as those of components of a conventional 3D flash memory, and thus, detailed descriptions thereof are omitted.

The substrate 1710 is characterized by being formed to be divided into a cell region 1711 in which at least one memory cell transistor related to the at least one memory cell string 1720 is formed and a peripheral portion region 1712 in which at least one peripheral-portion transistor, which corresponds to the remaining transistors excluding the memory cell transistor, from among transistors related to an operation of the 3D flash memory 1700, is formed. Hereinafter, the at least one memory cell transistor refers to a transistor directly related to data storing and read operations of the at least one memory cell string 1720 or a transistor used to connect the at least one memory cell string 1720 to a source electrode 1731, and the at least one peripheral-portion transistor refers to a transistor excluding the at least one memory cell transistor 1650, from among the transistors related to the operation of the 3D flash memory 1700. In addition, hereinafter, when the at least one memory cell transistor is referred to as being formed in the cell region 1711, it means that the at least one memory cell transistor is buried in the cell region 1711 on the substrate 1710. Also, when the at least one peripheral-portion transistor is referred to as being formed in the peripheral portion region 1712, it means that the at least one peripheral-portion transistor is buried in the peripheral portion region 1712 on the substrate 1710. In addition, for clarity of explanation, at least one memory cell transistor formed in the cell region 1711 and at least one peripheral-portion transistor formed in the peripheral portion region 1712 are not directly illustrated.

More specifically, the substrate 1710 according to an embodiment may be generated as a multilayered structure in which a bulk polysilicon substrate 1714 used as the cell region 1711 is stacked on a silicon substrate 1713 used as the peripheral portion region 1712.

Here, the bulk polysilicon substrate 1714 may be used for a bulk erase operation of the 3D flash memory 1700, and an interlayer insulating layer 1730 in which the source electrode 1731 is buried may be between the bulk polysilicon substrate 1714 and the silicon substrate 1713. Thus, at least one memory cell transistor formed in the bulk polysilicon substrate 1714 used as the cell region 1711 may connect the source electrode 1731 buried in the interlayer insulating layer 1730 to the at least one memory cell string 1720.

In addition, the bulk polysilicon substrate 1714 may be used not only in the bulk erase operation but also in a GIDL erase operation, the 3D flash memory 1700 including the bulk polysilicon substrate 1714 may support both the bulk erase operation and the GIDL erase operation.

As described above, the 3D flash memory 1700 according to the embodiment may divide the substrate 1710 into the cell region 1711 in which at least one memory cell transistor is formed and the peripheral portion region 1712 in which at least one peripheral-portion transistor is formed, and thus, a wiring process may be simplified in the application of a cell-on-peripheral circuit (COP).

Furthermore, the substrate 1710 is not limited to the multilayered structure described above and may have various structures divided into the cell region 1711 and the peripheral portion region 1712. A detailed description thereof will be presented with reference to FIGS. 18 and 19.

Figure 18:
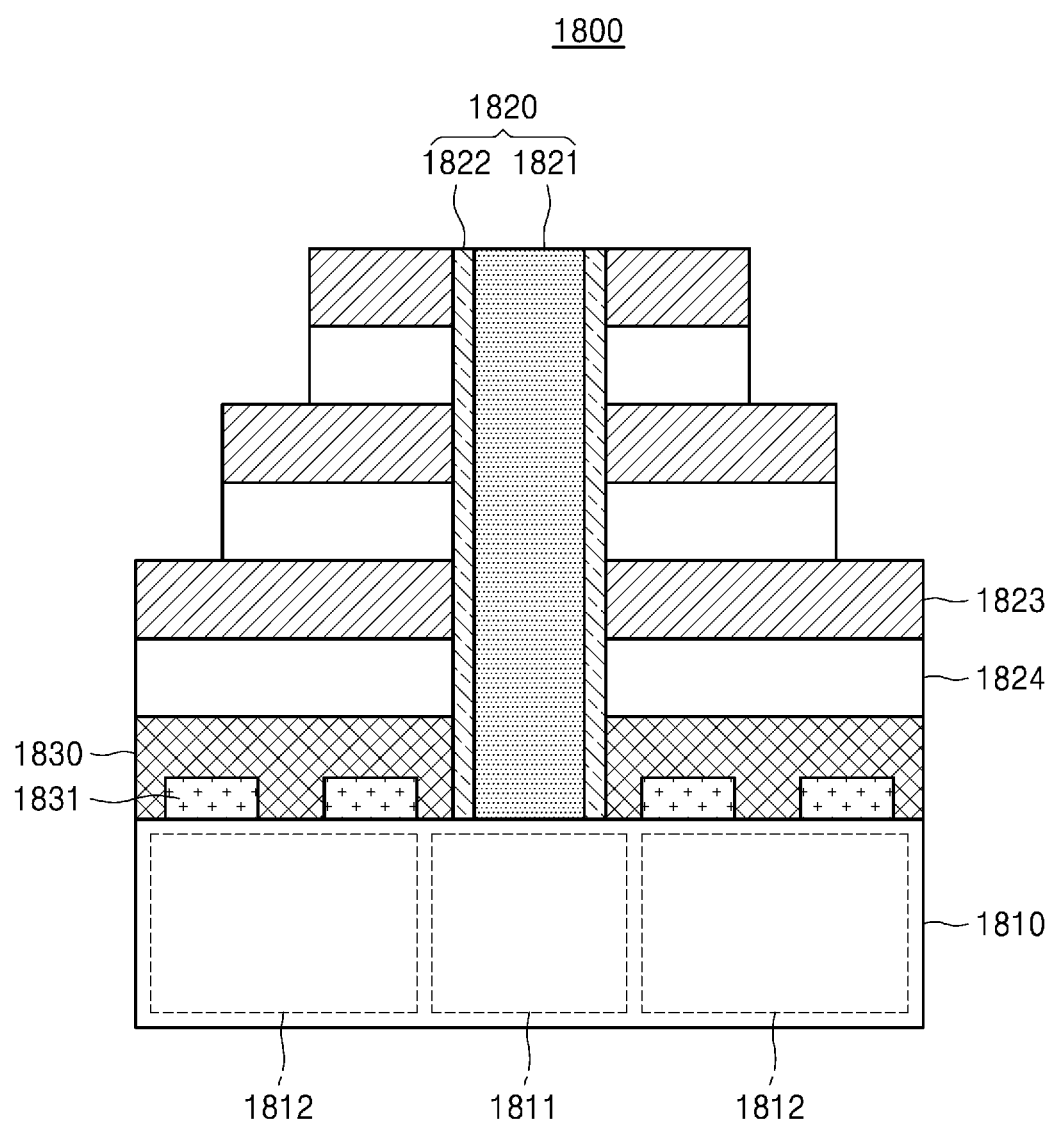
FIG. 18 is a vertical cross-sectional view of a 3D flash memory according to another embodiment.

FIG. 18 is a vertical cross-sectional view of a 3D flash memory according to another embodiment.

Referring to FIG. 18, like the 3D flash memory 1700 shown in FIG. 17, a 3D flash memory 1800 according to another embodiment may include a the substrate 1810 and at least one memory cell string 1820.

Similarly, at least one memory cell string 1820 may include at least one channel layer 1821 formed on a substrate 1810 to extend in one direction, and at least one charge storage layer 1822 surrounding the at least one channel layer 1821. A plurality of electrode layers 1823 and a plurality of insulating layers 1824 may be alternately connected to the at least one memory cell string 1820 in a vertical direction.

However, the 3D flash memory 1800 according to the embodiment is characterized by including the substrate 1810 having a different detailed structure from that of the 3D flash memory 1700 shown in FIG. 17. Naturally, the 3D flash memory 1800 according to the embodiment is the same as the 3D flash memory 1700 shown in FIG. 17 in that the substrate 1810 is formed to be divided into a cell region 1811 in which at least one memory cell transistor related to the at least one memory cell string 1820 is formed and a peripheral portion region 1812 in which at least one peripheral-portion transistor, which corresponds to the remaining transistors excluding the memory cell transistor, from among transistors related to an operation of the 3D flash memory 1800, is formed, the 3D flash memory 1800 according to the embodiment is different from the 3D flash memory 1700 shown in FIG. 17 in that the substrate 1810 is formed as a single layer.

More specifically, while the substrate 1810 is formed as the single layer, the cell region 1811 may be on a central portion of the substrate 1810 in which the at least one memory cell string 1820 is located (a central portion of the substrate 1810 corresponding to a lower portion of the at least one memory cell string 1820), and the peripheral portion region 1812 may be on a peripheral portion surrounding the cell region 1811 on the substrate 1810.

Here, an interlayer insulating layer 1830 in which a source electrode 1831 is buried may be on the substrate 1810. In this case, the at least one memory cell string 1820 may be formed to pass through the interlayer insulating layer 1830 and contact the substrate 1810. The source electrode 1831 may be buried in a peripheral portion excluding a central portion in which the at least one memory cell string 1820 is located on the interlayer insulating layer 1830. Thus, the source electrode 1831 buried in the interlayer insulating layer 1830 may be connected to the at least one memory cell string 1820 through at least one memory cell transistor formed in the cell region 1811.

In addition, the substrate 1810 may be formed to have the same width as an electrode layer having a greatest width, from among the plurality of electrode layers 1823. However, the present disclosure is not limited thereto, and the substrate 1810 may be formed to have a width greater than that of the plurality of electrode layers 1823 such that at least one peripheral-portion transistor is buried in a relatively greater number. A detailed description thereof will be presented with reference to FIG. 19.

Figure 19:
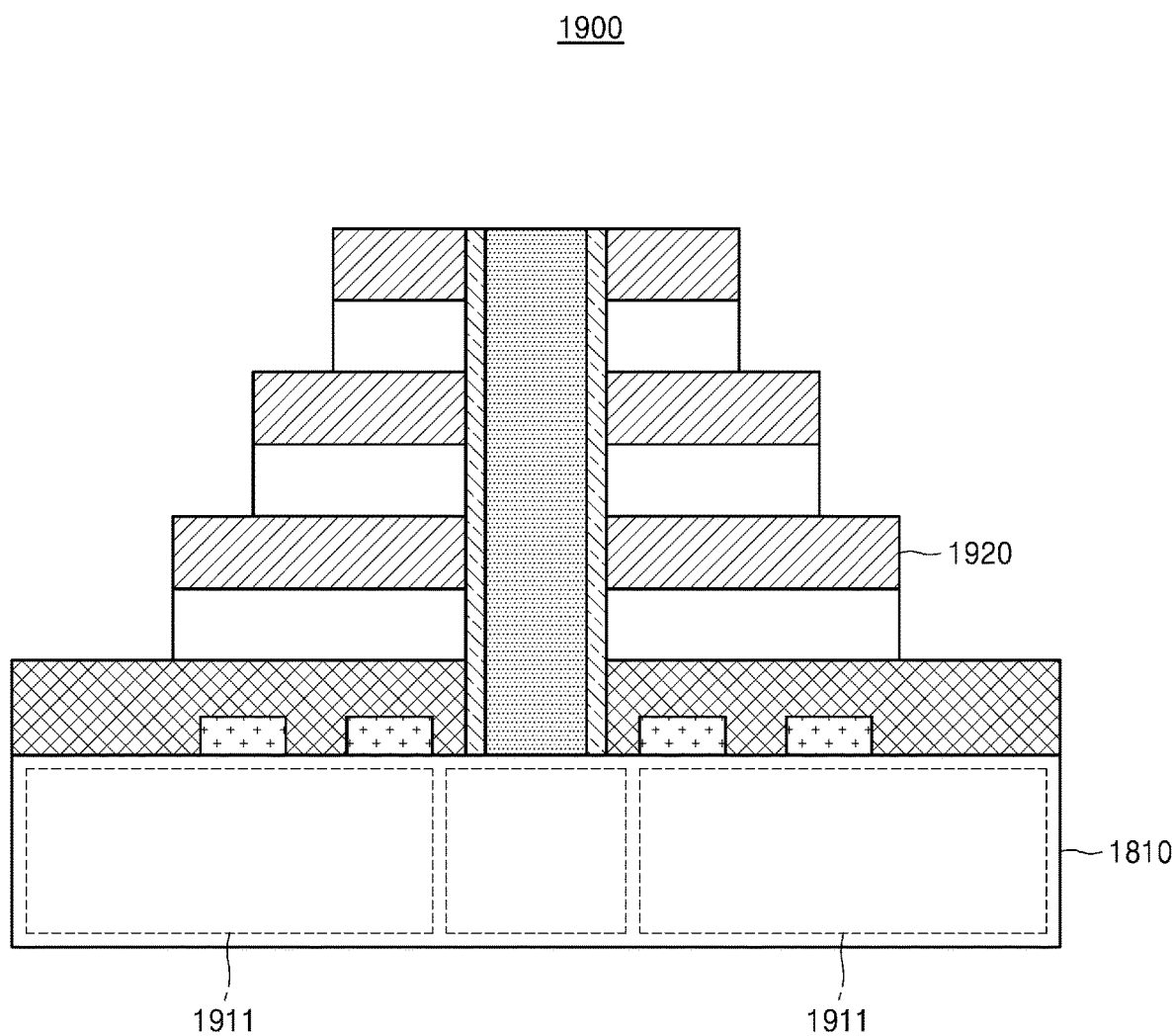
FIG. 19 is a vertical cross-sectional view of a 3D flash memory according to yet another embodiment.
Figure 20:
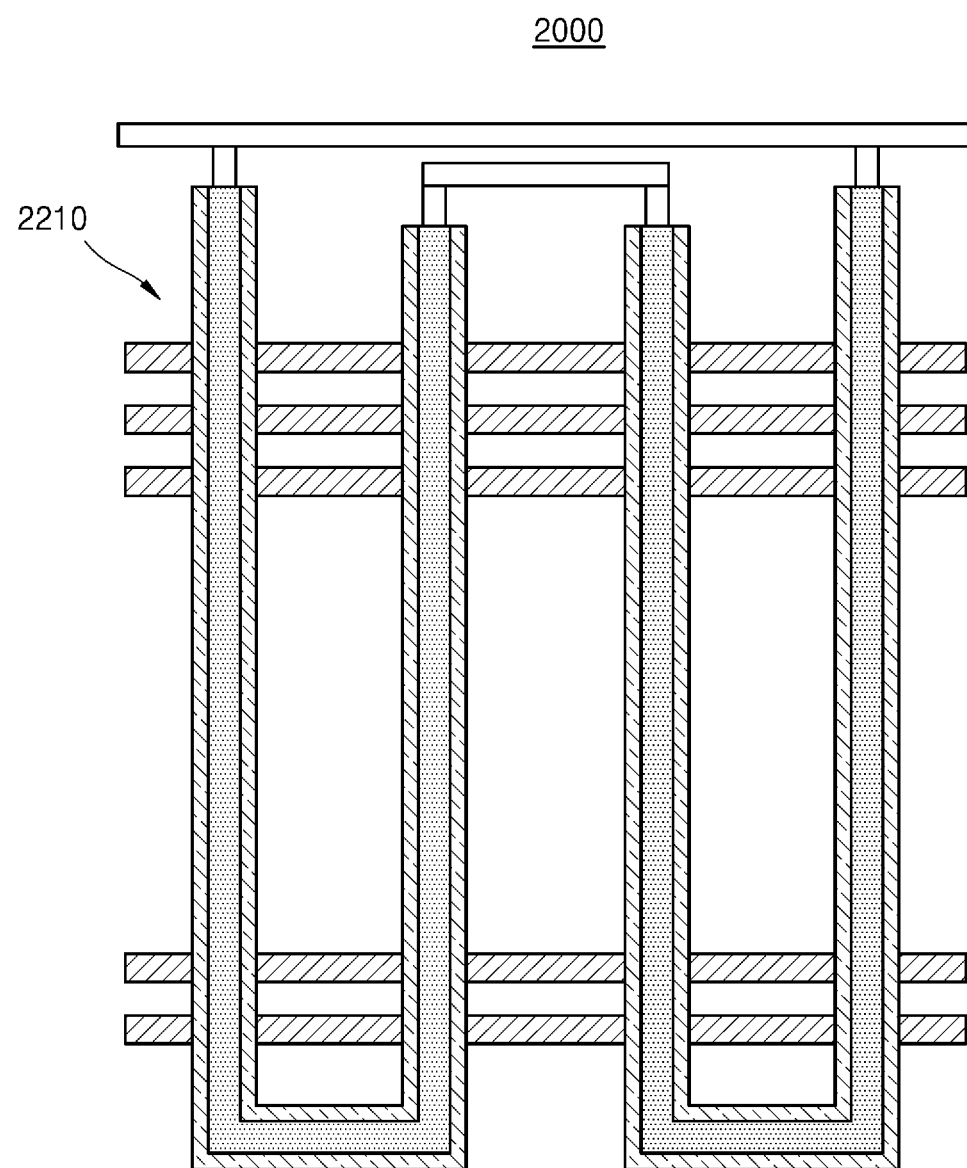
FIG. 20 a cross-sectional view of a 3D flash memory to which a conventional BiCS structure is applied.
Figure 21:
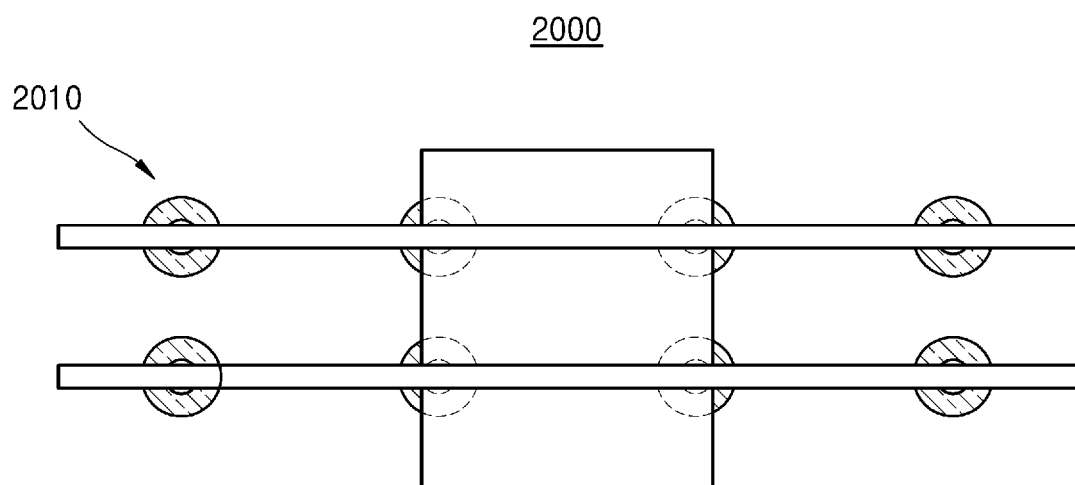
FIG. 21 is a top view of a 3D flash memory to which a conventional BiCS structure is applied.

FIG. 19 is a vertical cross-sectional view of a 3D flash memory according to another embodiment.

Referring to FIG. 19, although a 3D flash memory 1900 according to another embodiment has the same structure as the 3D flash memory 1800 shown in FIG. 18, the 3D flash memory 1900 may be different from the 3D flash memory 1800 in that a substrate 1910 is formed to a width greater than that of a plurality of electrode layers 1920.

Due to the structure described above, at least one peripheral-portion transistor may be buried in a greater number in the substrate 1910 than in the case described with reference to FIG. 18. In this case, a peripheral portion region 1911 may be densely in a portion corresponding to the plurality of electrode layers 1920 on the substrate 1910. Furthermore, a density at which the at least one peripheral-portion transistor is formed in the peripheral portion region 1911 may be higher in the portion corresponding to the plurality of electrode layers 1920 on the substrate 1910 than in an outer portion of the portion corresponding to the plurality of electrode layers 1920 on the substrate 1910.

Figure 22:
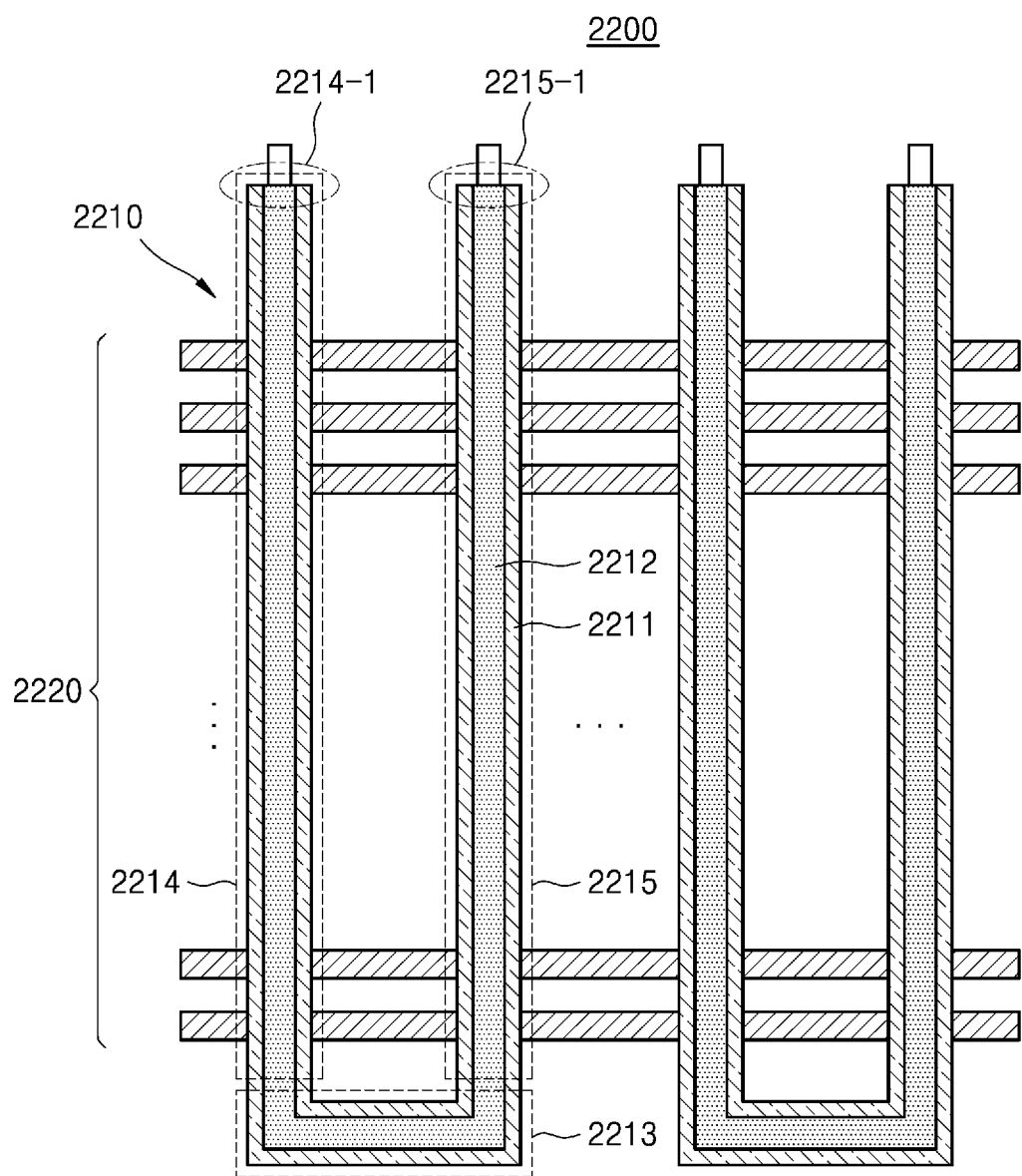
FIG. 22 is a cross-sectional view of a 3D flash memory according to an embodiment.
Figure 23:
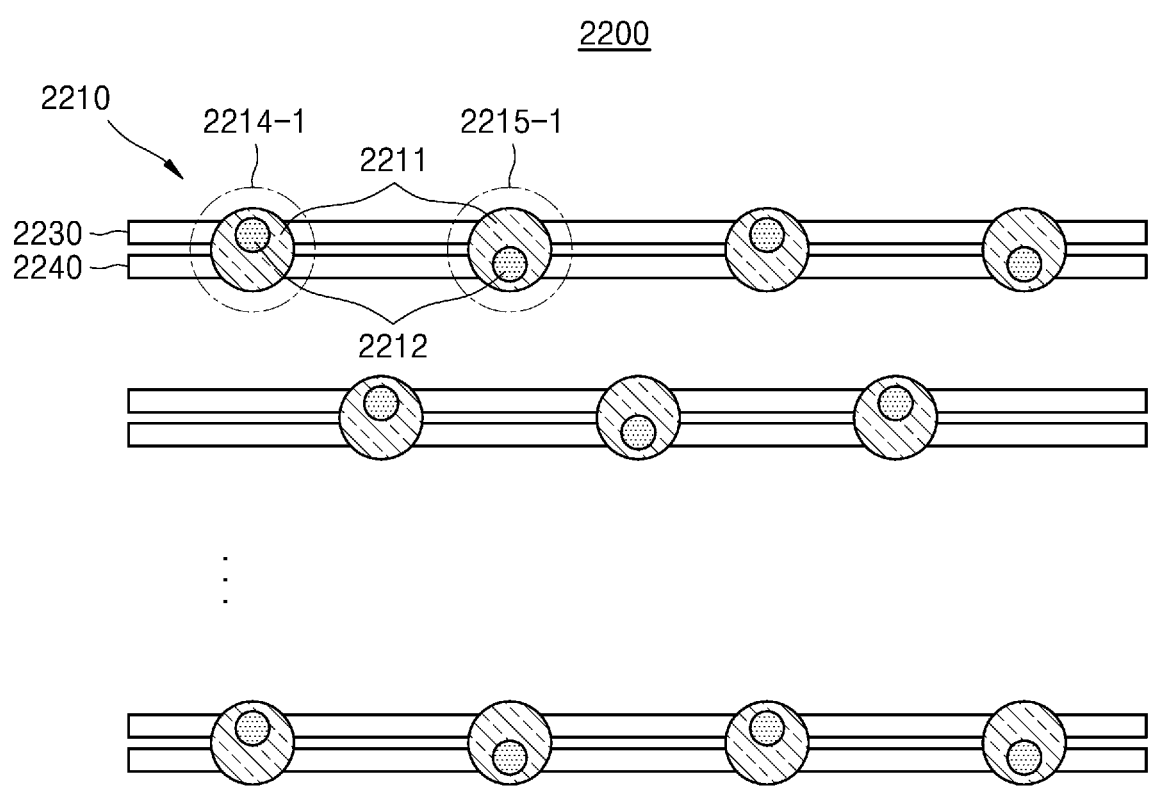
FIG. 23 is a top view of a 3D flash memory according to an embodiment.

FIG. 22 is a cross-sectional view of a 3D flash memory according to an embodiment, and FIG. 23 is a top view of a 3D flash memory according to an embodiment.

Referring to FIGS. 22 and 23, a 3D flash memory 2200 according to an embodiment includes at least one string 2210, a plurality of word lines 2220, and two bit lines 2230 and 2240. Hereinafter, the two bit lines 2230 and 2240 are illustrated only in FIG. 23 for brevity, and only contacts by which the two bit lines 2230 and 2240 are connected to the at least one string 2210 are illustrated in FIG. 22.

The at least one string 2210 includes a charge storage layer 2211 formed to extend in a hollow tube form on a substrate (not shown) and a channel layer 2212 filling the inside of the charge storage layer 2211. The charge storage layer 2211 may be a component configured to store charges due to a voltage applied through the plurality of word lines 2220. In the 3D flash memory 2200, the charge storage layer 2211 may serve as a data storage and have, for example, an ONO structure. The channel layer 2212 may be formed of single crystalline silicon or polysilicon. Similar to the charge storage layer 2211, the channel layer 2212 may be formed in a hollow tube form and further include a buried film (not shown) in the hollow tube form. Thus, the at least one string 2210 may include memory cells corresponding respectively to the plurality of word lines 2220 connected in the vertical direction.

In this case, the at least one string 2210 is characterized in that the at least one string 2210 has a U shape and includes a horizontal portion 2213 and vertical portions 2214 and 2215 for the substrate and, particularly, the vertical portions 2214 and 2215 have symmetrical shapes with respect to the horizontal portion 2213. Hereinafter, when the vertical portions 2214 and 2215 are referred to as being symmetrical with respect to the horizontal portion 2213, it means that the vertical portions 2214 and 2215 have the same shape and thickness with respect to the horizontal portion 2213 and ends 2214-1 and 2215-1 of the vertical portions 2214 and 2215 are formed to have the same height. In addition, hereinafter, the ends 2214-1 and 2215-1 of the vertical portions 2214 and 2215 refer to both ends 2214-1 and 2215-1 of the U shape of the at least one string 2210, and thus, will be used interchangeably.

The plurality of word lines 2220 may be formed of a conductive material, such as tungsten (W), titanium (Ti), tantalum (Ta), copper (Cu), or gold (Au), so that the plurality of word lines 2220 may be orthogonal to and connected to the vertical portions 2214 and 2215 of the at least one string 2210. Thus, the plurality of word lines 2220 may perform a program operation and an erase operation by applying a voltage to memory cells corresponding respectively thereto. A plurality of insulating layers (not shown) may be between the plurality of word lines 2220.

The two bit lines 2230 and 2240 are connected to the both ends 2214-1 and 2215-1 of the at least one string 2210 while being formed to extend parallel to the horizontal portion 2213 of the at least one string 2210. Here, because the both ends 2214-1 and 2215-1 of the at least one string 2210 are symmetrically located at the same height, the two bit lines 2230 and 2240 may be on the same plane. When the two bit lines 2230 and 2240 are referred to as being on the same plane, it means that the two bit lines 2230 and 2240 are formed at the same height and not layered. For example, the two bit lines 2230 and 2240 may be formed on the same plane to extend in an x-axial direction, and be connected to the both ends 2214-1 and 2215-1 of the at least one string 2210.

In this case, when the both ends 2214-1 and 2215-1 of the at least one string 2210 are referred to as being connected to the two bit lines 2230 and 2240, it means that the channel layer 2212 is connected to the two bit lines 2230 and 2240 at the both ends 2214-1 and 2215-1 of the at least one string 2210. Accordingly, in order that the channel layer 2212 at the both ends 2214-1 and 2215-1 of the at least one string 2210 may be connected to the two bit lines 2230 and 2240 located on the same plane, positions at which the channel layer 2212 is formed on cross-sections of the both ends 2214-1 and 2215-1 of the at least one string 2210 may be misaligned from each other. In an example, the channel layer 2212 may be formed to be offset upward on the cross-section of the end 2214-1 of one vertical portion (e.g., 2214) of the at least one string 2210, and formed to be offset downward on the cross-section of the end 2215-1 of a remaining vertical portion (e.g., 2215). Thus, the channel layer 2212 at the both ends 2214-1 and 2215-1 of the at least one string 2212 may be connected to the two bit lines 2230 and 2240 located on the same plane.

Each of the two bit lines 2230 and 2240 is characterized by being selectively used as either a drain line or a source line. Hereinafter, when each of the two bit lines 2230 and 2240 is referred to as being selectively usable as either the drain line or the source line, it means that each of the two bit lines 2230 and 2240 may be used as the drain line or the source line according to circumstances. More specifically, it means that, in response to a case in which one bit line (e.g., 2240) of the two bit lines 2230 and 2240 is used as either the drain line or the source line, the other bit line (e.g., 2230) is used as the other one of the drain line and the source line, excluding the one as which the bit line 2240 is used. In an example, when the first bit line 2230 is used as the drain line, the second bit line 2240 may be used as the source line; whereas when the first bit line 2230 is used as the source line, the second bit line 2240 may be used as the drain line.

In this case, each of the two bit lines 2230 and 2240 may be selectively used as either the drain line or the source line, based a required voltage to be applied to the both ends 2214-1, 2215-1 of the at least one string 2210. That is, when a program operation, an erase operation, or a read operation of the 3D flash memory 2200 is performed, each of the two bit lines 2230 and 2240 may be selectively used as either the drain line or the source line based on the required voltage to be applied to the both ends 2214-1 and 2215-1 of the at least one string 2210. A detailed description thereof will be presented with reference to FIG. 24.

As described above, because the 3D flash memory 2200 according to an embodiment includes the at least one string 2210 in which the vertical portions 2214 and 2215 are symmetrical to each other, various problems (a problem of weak recognition margins due to a reduction in cell current during a read operation, problems of speed reduction due to an increase in boosting area and an increase in power consumption related to a pass voltage applied to a word line due to an increase in the number of unselected word lines during a program operation, and problems of an increase in bulk potential rise time and an increase in hole injection time during an erase operation) caused by a string having an asymmetric structure may be fundamentally solved.

Furthermore, the 3D flash memory 2200 may use a word line located adjacent to an upper portion of the horizontal portion 2213 of the at least one string 2210 of the plurality of word lines 2220 as an MSL to which signals for the program operation, the erase operation, and the read operation are applied. A detailed description thereof will be presented with reference to FIG. 25A.

Figure 24:
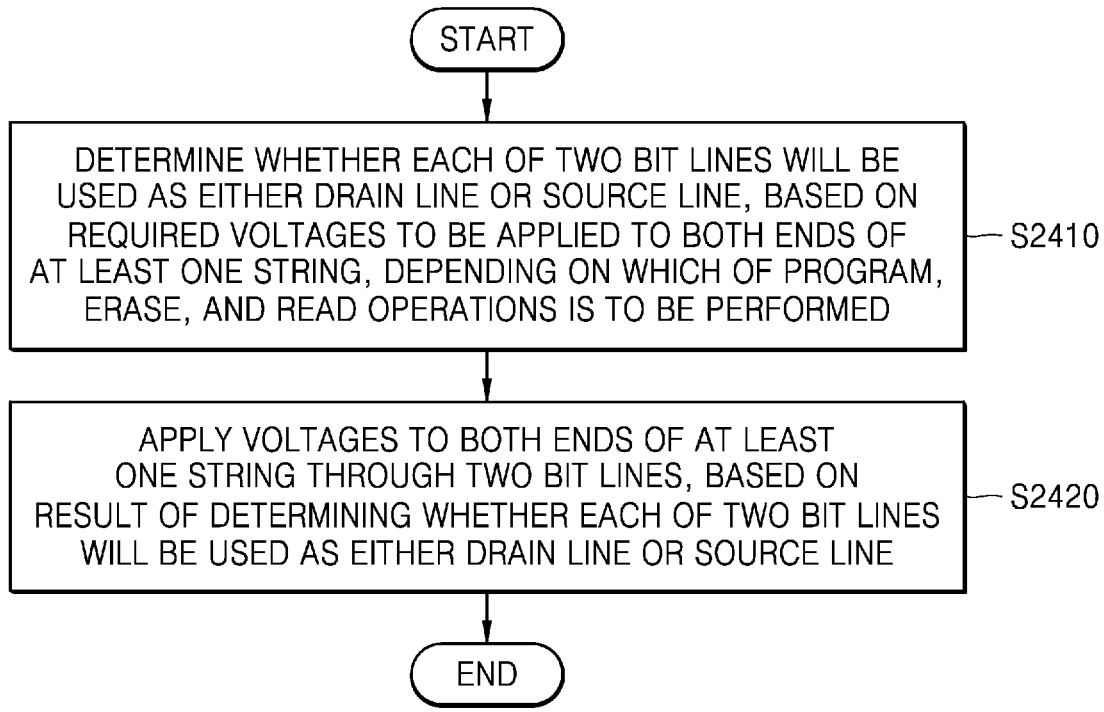
FIG. 24 is a flowchart of a method of operating a 3D flash memory according to an embodiment.

FIG. 24 is a flowchart of a method of operating a 3D flash memory, according to an embodiment.

Referring to FIG. 24, in operation S2410, the 3D flash memory according to the embodiment determines whether each of bit lines will be used as either a drain line or a source line, based on required voltages to be applied to both ends of at least one string, depending on which of a program operation, an erase operation, and a read operation is to be performed.

For example, the required voltages to be applied to the both ends of the at least one string have to be a ground voltage and a power supply voltage in order that the 3D flash memory may perform the program operation. Accordingly, it may be determined that any one bit line of two bit lines connected to the both ends of the at least one string will be used as a source line to which the ground voltage is to be applied, and it may be determined that the other bit line will be used as a drain line to which the power supply voltage is to be applied.

Thereafter, in operation S2420, the 3D flash memory applies voltages to the both ends of the at least one string through the two bit lines based on the result of determining whether each of the two bit lines will be used as either the drain line or the source line.

As described above, when controlling a program operation, an erase operation, or a read operation on at least one string of a symmetric structure, the 3D flash memory according to the embodiment selectively uses each of the two bit lines as either the drain line or the source line. Accordingly, while fundamentally solving various problems caused by a string of an asymmetric structure, integration may be promoted, and operation efficiency may be improved.

Figure 25A:
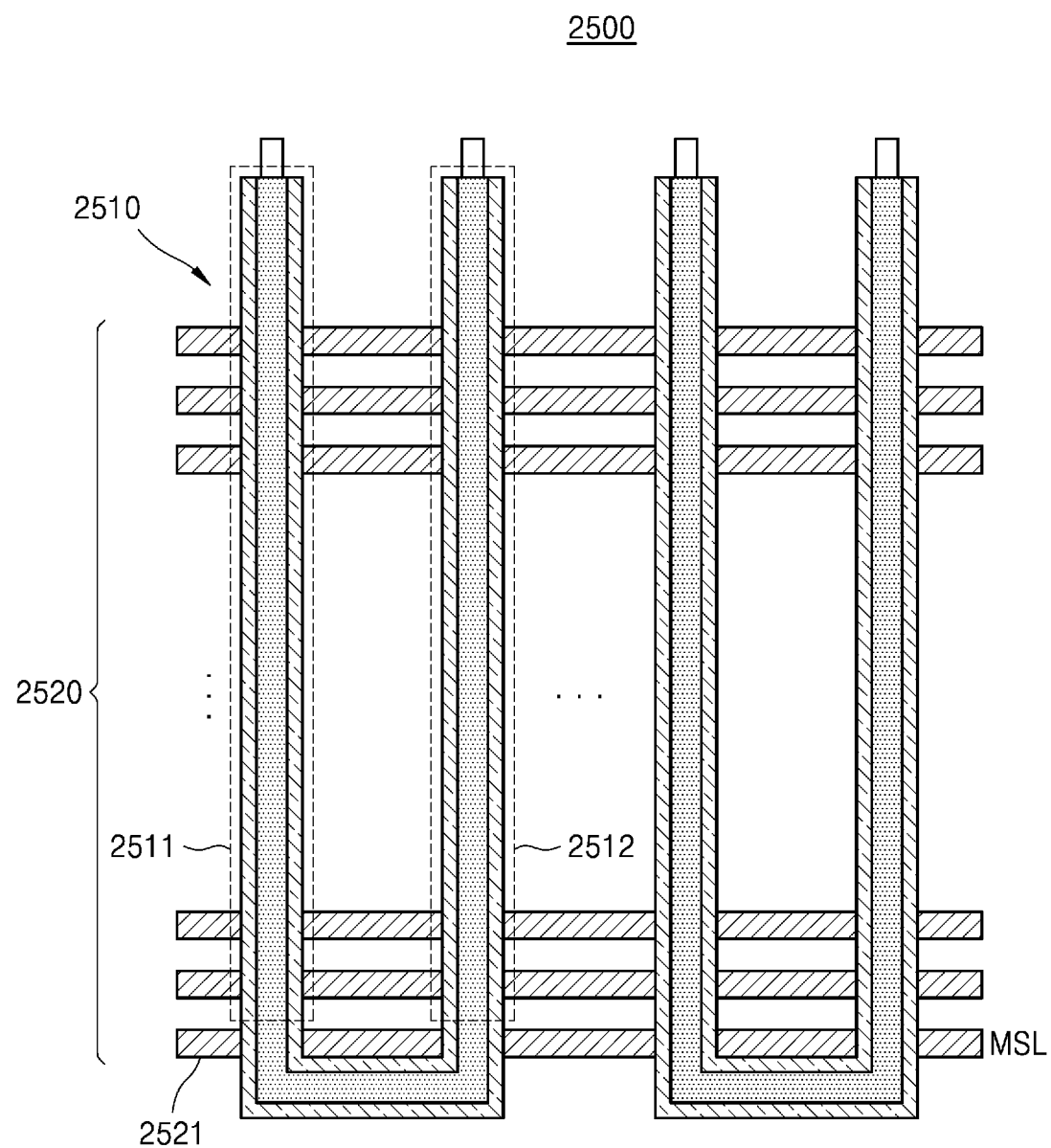
FIGS. 25A and 25B are cross-sectional views for explaining a 3D flash memory including a middle signal line (MSL), according to an embodiment.
Figure 25B:
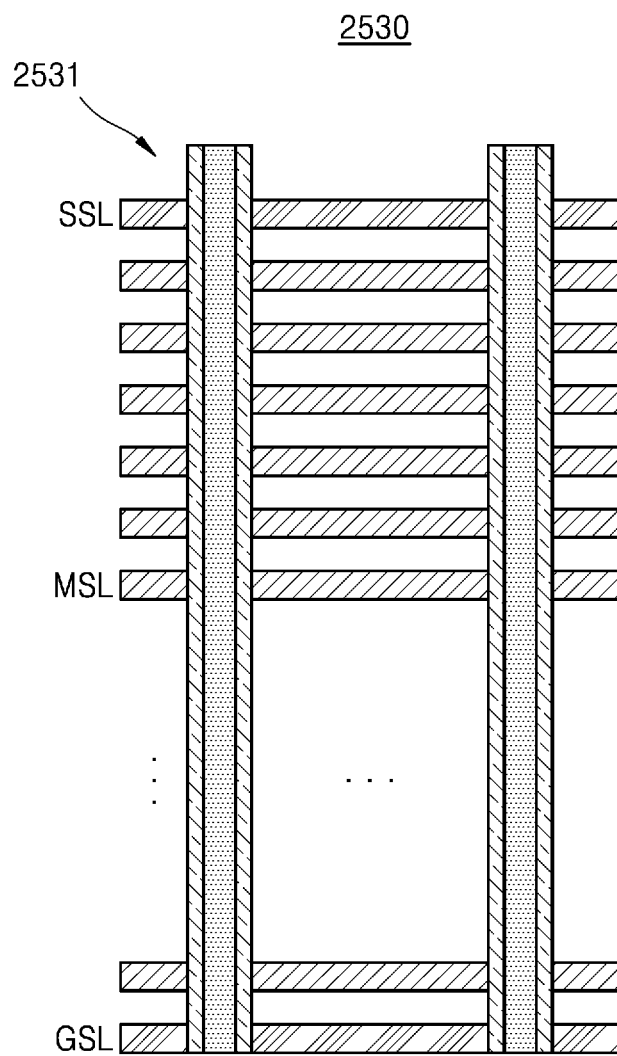

FIGS. 25A and 25B are cross-sectional views of 3D flash memory including an MSL, according to an embodiment.

Referring to FIGS. 25A and 25B, a 3D flash memory 2500 may have the same structure as the 3D flash memory described with reference to FIGS. 22 and 23. For example, like the at least one string of the 3D flash memory described with reference to FIGS. 22 and 23, in at least one string 2510 included in the 3D flash memory 2500, vertical portions 2511 and 2512 may be symmetrical with respect to a horizontal portion 2513.

However, unlike the 3D flash memory described with reference to FIGS. 22 and 23, the 3D flash memory 2500 is characterized in that a word line 2521 located adjacent to an upper portion of the horizontal portion 2513, from among a plurality of word lines 2520, is used as an MSL to which signals for a program operation, an erase operation, and a read operation are applied.

Here, the 3D flash memory 2500 including the at least one string 2510 having a U shape may be considered the same as the 3D flash memory 2530 including the at least one string 2531 having a vertical shape shown in FIG. 25B in the functional aspect. In this case, because the word line 2521 located adjacent to the upper portion of the horizontal portion 2513, from among the plurality of word lines 2520, is in a middle region of a string of the 3D flash memory 2530, the word line 2521 located adjacent to the upper portion of the horizontal portion 2513, from among the plurality of word lines 2520, will be hereinafter referred to as an MSL and interchangeably described as an MSL 2521.

In this case, the MSL 2521 may deplete one vertical portion (e.g., 2511) of the vertical portions 2511 and 2512 of the at least one string 2510 and perform a program operation on a specific memory cell on the other vertical portion (e.g., 2512). Also, the MSL 2521 may inject holes into both the vertical portions 2511 and 2512 of the at least one string 2510 and perform an erase operation on the at least one string 2510.

For example, the 3D flash memory 2500 may apply a ground voltage to an end of any one vertical portion (e.g., 2511), apply a power supply voltage to an end of the other vertical portion (e.g., 2512), and apply a blocking voltage for depleting the vertical portion 2511 to the MSL 2521, and thus, the 3D flash memory 2500 may perform a program operation on a specific memory cell on the vertical portion 2512.

In another example, the 3D flash memory 2500 may apply a blocking voltage for maintaining the MSL 2521 in an off state to the MSL 2521 or float the MSL 2521 and then inject holes to both the vertical portions 2511 and 2512 by applying an erase voltage to both ends of the vertical portions 2511 and 2512, and thus, the 3D flash memory 2500 may perform an erase operation on the at least one string 2510.

In yet another example, the 3D flash memory 2500 may apply a read voltage to an end of any one vertical portion in which a specific memory cell to be read is located, from among the vertical portions 2511 and 2512 of the at least one string 2510 and apply a ground voltage to an end of the remaining vertical portion to float the MSL 2521, and thus, the 3D flash memory 2500 may perform a read operation on the specific memory cell.

Detailed descriptions of the program, erase, and read operations of the 3D flash memory 2500 will be presented with reference to FIGS. 26 to 31.

As described above, the 3D flash memory 2500 according to an embodiment may use the word line 2521, which is located adjacent to the upper portion of the horizontal portion 2513, from among the plurality of word lines 2520, as the MSL to which the signals for the program operation, the erase operation, and the read operation are applied, and thus, an area boosted in a conventional 3D flash memory may be significantly reduced. Thus, speed may be improved during the program operation, power consumption related to a pass voltage applied to an unselected word line may be reduced, and a bulk potential rise time and a hole injection time may be reduced during the erase operation. In addition, during a read operation, a problem of weak recognition margins due to a reduction in cell current may be solved.

Although a case in which one word line (e.g., 2521) located adjacent to the upper portion of the horizontal portion 2513, from among the plurality of word lines 2520, is used as the MSL has been described above, the present disclosure is not limited thereto, and a word line located at an arbitrary position or a plurality of word lines, from among the plurality of word lines 2520, may be used. In this case, the structure described above and an operation method described below may be applied as they are.

Figure 27:
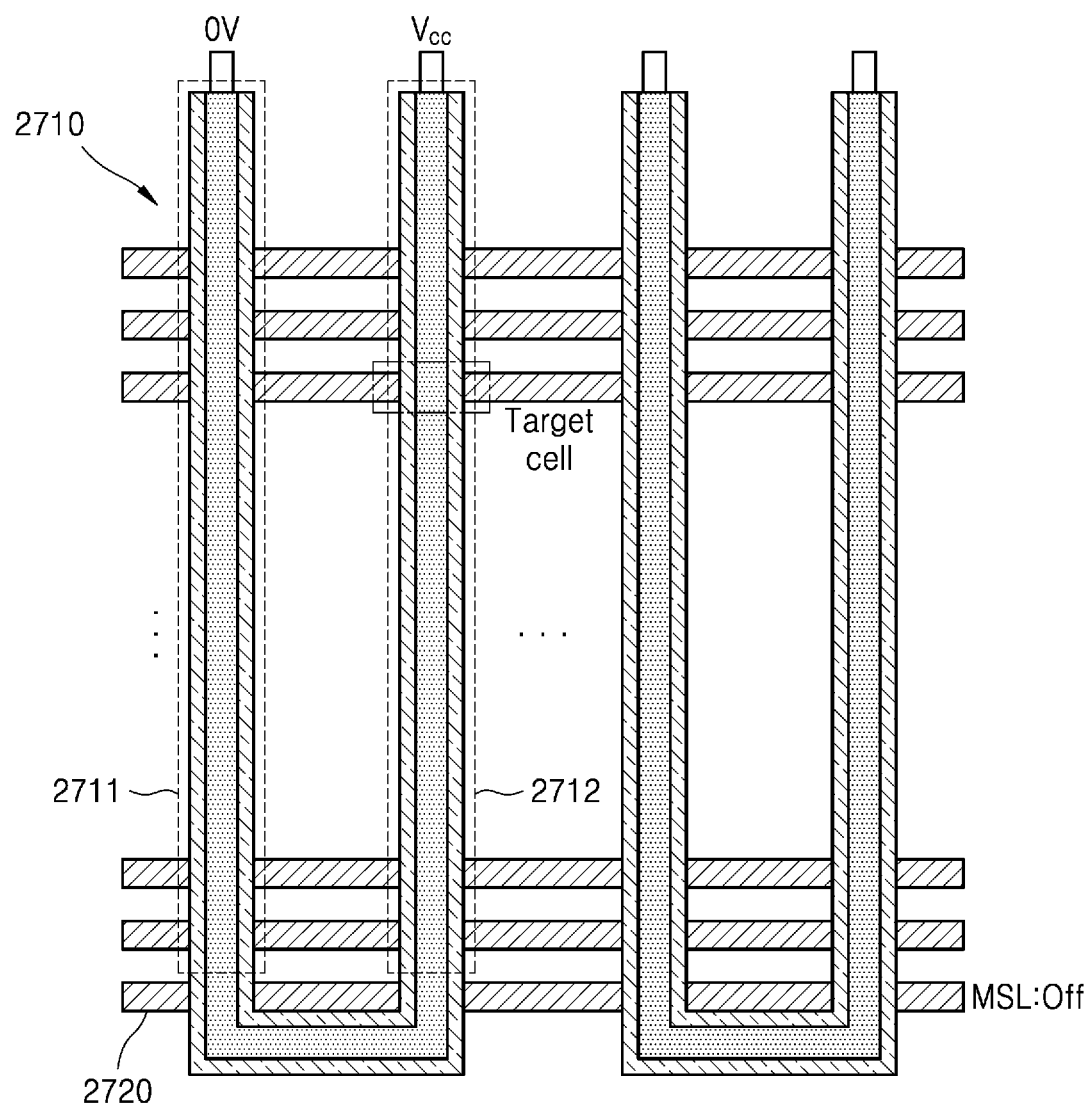
FIG. 27 is a cross-sectional view for explaining a program operation method of a 3D flash memory according to an embodiment.

FIG. 25 is a flowchart of a program operation method of a 3D flash memory, according to an embodiment, and FIG. 27 is a cross-sectional view for explaining a program operation method of a 3D flash memory, according to an embodiment.

Figure 26:
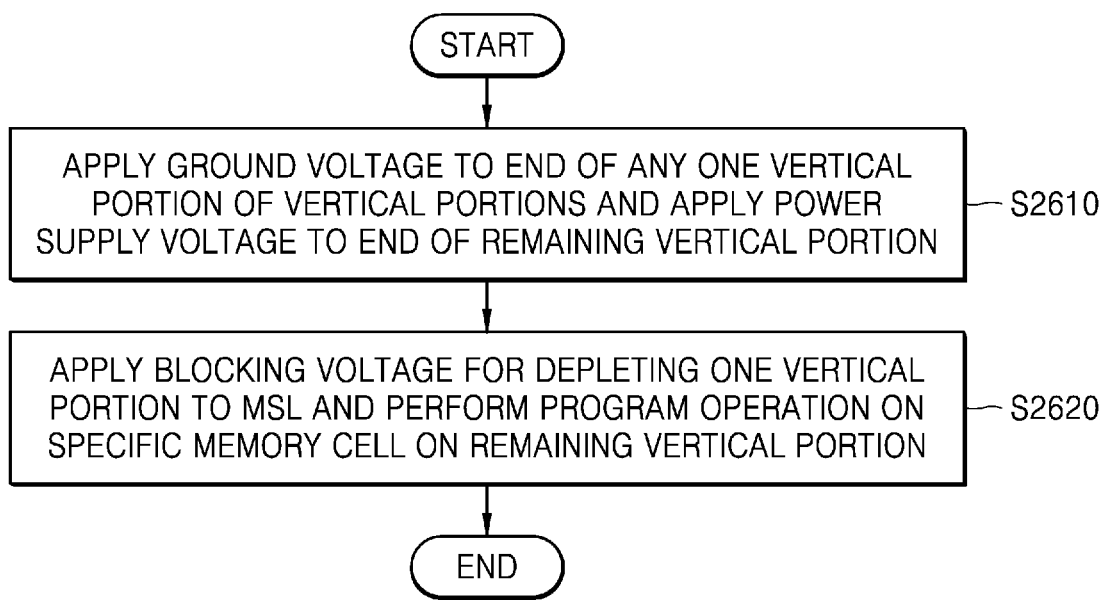
FIG. 26 is a flowchart of a program operation method of a 3D flash memory according to an embodiment.

Referring to FIGS. 26 and 27, in operation S2610, the 3D flash memory according to an embodiment may apply a ground voltage to an end of any one vertical portion (e.g., 2711) of vertical portions 2711 and 2712 included in at least one string 2710 and apply a power supply voltage to an end of the other vertical portion (e.g., 2712). In this case, the vertical portion 2712 to which the power supply voltage is applied may be a string in which a specific memory cell to be programmed is located.

Thereafter, in operation S2620, the 3D flash memory may apply a blocking voltage for depleting the vertical portion 2711 to an MSL 2720 and perform a program operation on a specific memory cell on the vertical portion 2712.

For example, in operation S2610, the 3D flash memory applies a ground voltage of 0 V to a bit line connected to the end of the vertical portion 2711, apply a power supply voltage of Vcc (e.g., 20 V) to a bit line connected to the end of the vertical portion 2712. Simultaneously, in operation S2620, the 3D flash memory applies a blocking voltage to the MSL 2720 and turn off the MSL 2720. Accordingly, the 3D flash memory may perform a program operation by boosting only the vertical portion 2712.

As described above, because the 3D flash memory performs the program operation by boosting only one vertical portion 2712 from among the vertical portions 2711 and 2712, program operation speed may be improved, and power consumption related to a pass voltage applied to an unselected word line may be reduced.

Furthermore, in operation S2620, the 3D flash memory applies a pass voltage to remaining word lines excluding a word line corresponding to the specific memory cell, from among a plurality of word lines, and applies a program voltage to the word line corresponding to the specific memory cell, and thus, the 3D flash memory may perform the program operation on the specific memory cell. Because the operation of applying the voltage to the word lines is the same as the operation of the conventional 3D flash memory in a program process, a detailed description thereof is omitted. Similarly, because respective operations of applying voltages to the word lines during an erase operation and a read operation to be described below are also the same as those of the conventional 3D flash memory, detailed descriptions thereof will also be omitted.

Figure 28:
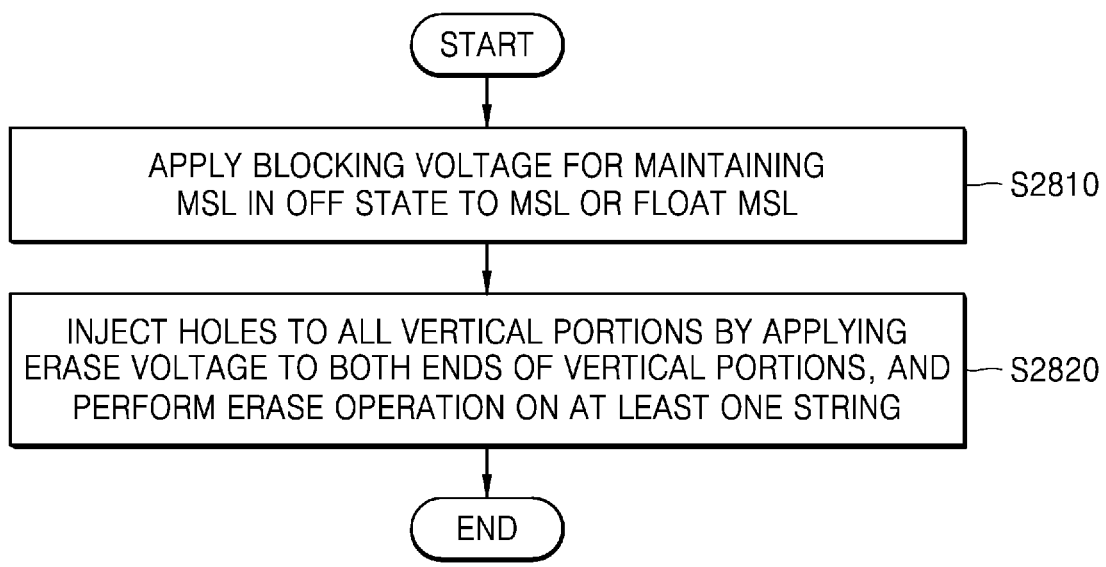
FIG. 28 is a flowchart of an erase operation method of a 3D flash memory according to an embodiment.
Figure 29:
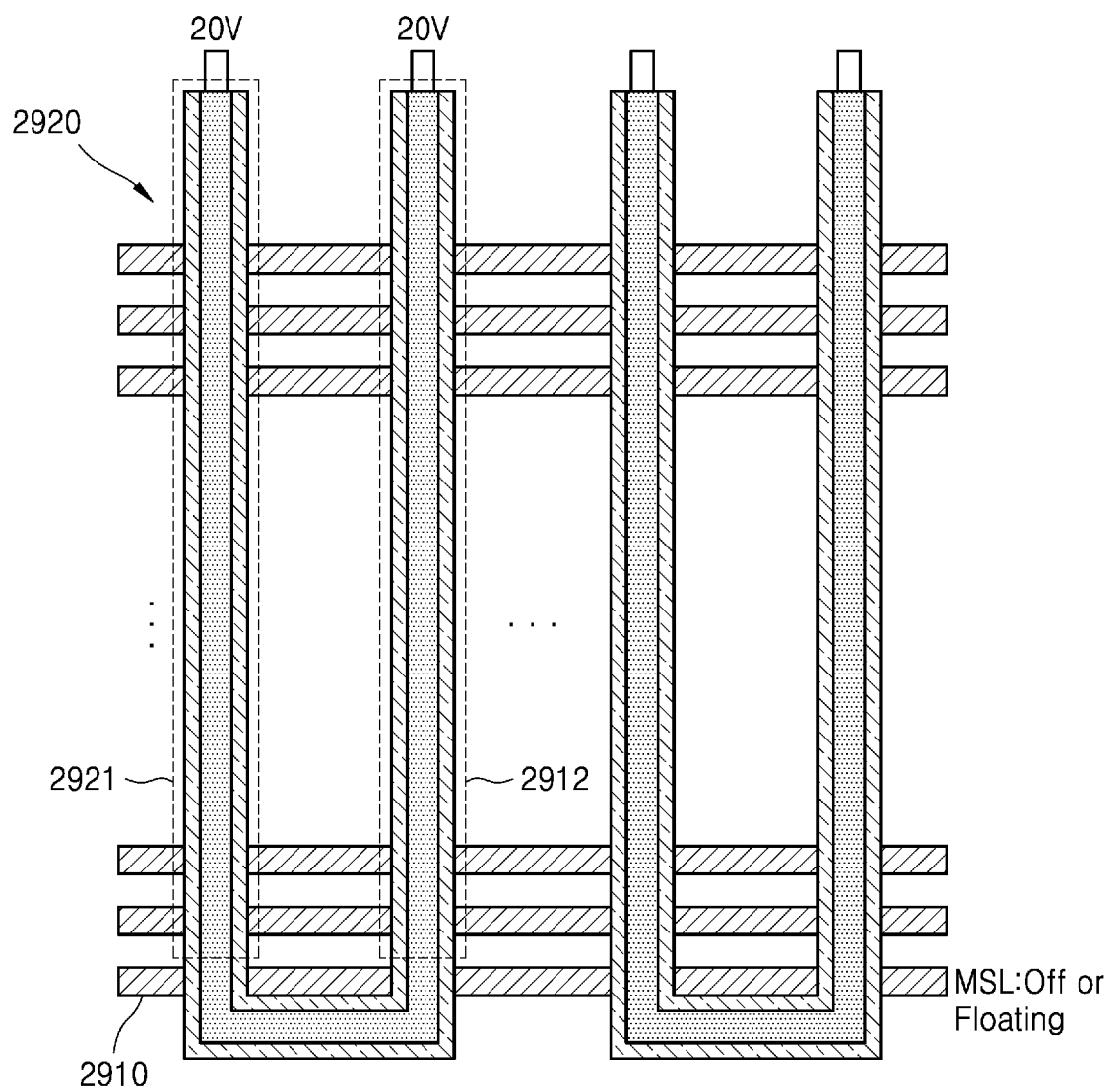
FIG. 29 is a cross-sectional view for explaining an erase operation method of a 3D flash memory according to an embodiment.

FIG. 28 is a flowchart of an erase operation method of a 3D flash memory, according to an embodiment, and FIG. 29 is a cross-sectional view for explaining an erase operation method of a 3D flash memory, according to an embodiment.

Referring to FIGS. 28 and 29, in operation S2810, a 3D flash memory according to an embodiment applies a blocking voltage for maintaining an MSL 2910 in an off state to the MSL 2910 or float the MSL 2910.

Thereafter, in operation S2820, the 3D flash memory applies an erase voltage to both ends of vertical portions 2921 and 2922 included in at least one string 2920 and inject holes to both the vertical portions 2921 and 2922, and thus, the 3D flash memory performs an erase operation on the at least one string 2920.

For example, the 3D flash memory applies an erase voltage of 20 V to two bit lines respectively connected to the vertical portions 2921 and 2922 in operation S2820 while applying the blocking voltage for maintaining the MSL 2910 in the off state in operation S2810, and simultaneously injects holes to both the vertical portions 2921 and 2922, and thus, the 3D flash memory may perform an erase operation on the at least one string 2920.

As described above, because the 3D flash memory performs the erase operation by simultaneously injecting holes to the vertical portions 2921 and 2922, each of which has a length corresponding to half of a total length of the at least one string 2920, a bulk potential rise time and a hole injection time may be reduced by half, as compared to a conventional erase technique by which holes are injected into any one of the vertical portions 2921 and 2922 to perform an erase operation on the entire string until the injection of the holes is completed.

Figure 30:
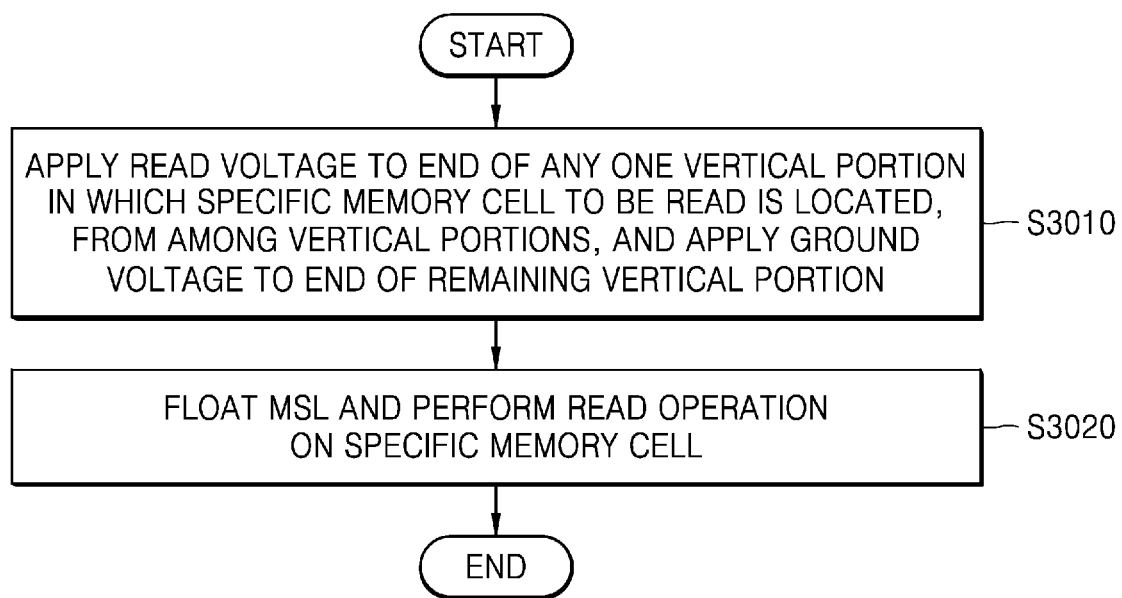
FIG. 30 is a flowchart of a read operation method of a 3D flash memory according to an embodiment.
Figure 31:
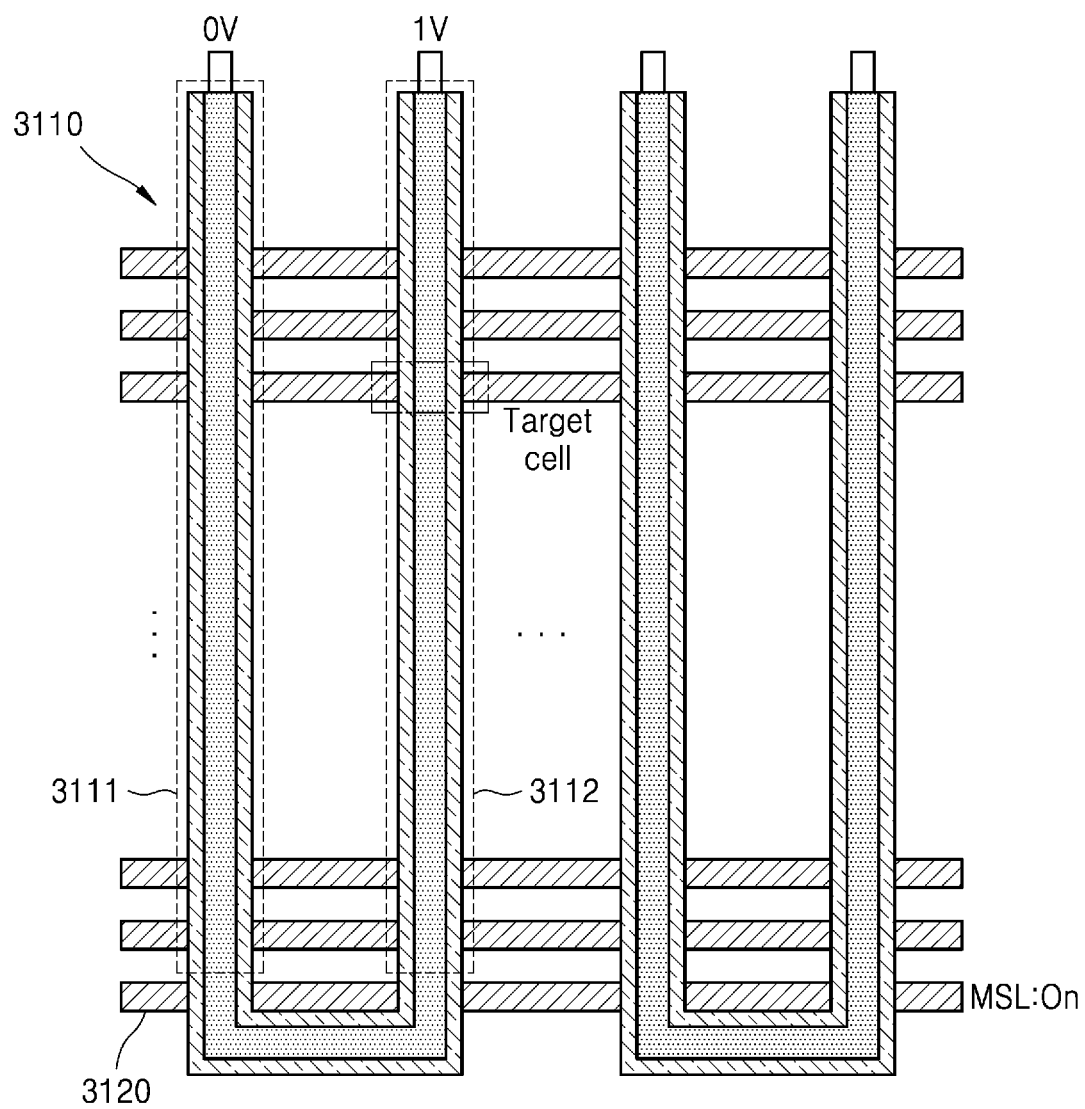
FIG. 31 is a cross-sectional for explaining a read operation method of a 3D flash memory, according to an embodiment.

FIG. 30 is a flowchart of a read operation method of a 3D flash memory, according to an embodiment, and FIG. 31 is a cross-sectional view for explaining a read operation method of a 3D flash memory, according to an embodiment.

Referring to FIGS. 30 and 31, in operation S3010, a 3D flash memory according to an embodiment applies a read voltage to an end of any one vertical portion (e.g., 3112) in which a specific memory cell to be read is located, from among vertical portions 3111 and 3112 of at least one string 110, and applies a ground voltage to an end of a remaining vertical portion (e.g., 3111).

Thereafter, in operation S3020, the 3D flash memory performs a read operation on the specific memory cell by floating an MSL 3120.

For example, in operation S3010, the 3D flash memory applies a read voltage of 1 V to a bit line connected to the vertical portion 3112 in which the specific memory cell is located, and applies a ground voltage of 0 V to a bit line connected to the end of the vertical portion 3111. Simultaneously, in operation S3020, the 3D flash memory may maintain the MSL 3120 in an on state by floating the MSL 3120, and perform the read operation on the specific memory cell.

As described above, because the 3D flash memory preferentially performs the read operation on one vertical portion (e.g., 3112) of the vertical portions 3111 and 3112, the read operation may be improved, and a problem of weak recognition margins due to a reduction in cell current may be solved. Also, errors according to an electrode direction may be minimized.

Although the embodiments have been described above with reference to limited embodiments and drawings, it will be understood by one of ordinary skill in the art that various changes and modifications may be made therein from the above descriptions. For example, even when the described techniques are performed in different orders from the described methods and/or even when the described components (e.g., systems, structures, devices, circuits, and the like) are combined in different forms than in the described methods or are replaced with other components or equivalents, appropriate results may be achieved.

Therefore, other implementations, other embodiments, and equivalents to the claims also fall within the scope and spirit of the claims described below.

The invention claimed is:

1. A three-dimensional (3D) flash memory to which a small block is applied, the 3D flash memory comprising:
   a plurality of memory cell strings formed on a substrate to each extend in one direction, each memory cell string comprising a channel layer and a charge storage layer surrounding the channel layer;
   a plurality of word lines connected to the plurality of memory cell strings and stacked in a vertical direction, the plurality of word lines being grouped into a plurality of word line sets, the plurality of word line sets respectively corresponding to a plurality of small blocks into which vertical-direction memory regions of the at least one memory cell string are grouped; and
   at least one switching element connected to a word line wiring configured to control word line sets of the plurality of word lines, the word line wiring and at least one switching element being configured to selectively apply a voltage to any one word line set of the plurality of word line sets.

2. The 3D flash memory of claim 1, wherein the word line wiring is shared between the small blocks.

3. The 3D flash memory of claim 1, wherein the 3D flash memory is configured to independently perform an erase operation on each of the at least one memory cell string for each of the small blocks.

4. The 3D flash memory of claim 1, wherein the plurality of word lines are formed apart from each other and divided by the plurality of word line sets.

5. The 3D flash memory of claim 1, wherein at least one bit line configured to control the at least one memory cell string is shared between the small blocks, and is configured to be selectively connected to any one small block of the small blocks by using a plurality of string selection lines connected to the at least one bit line.

6. A three-dimensional (3D) flash memory comprising:
   at least one string formed in a U shape to include a horizontal portion and vertical portions with respect to a substrate, the at least one string comprising a charge storage layer formed to extend in a hollow tube form and a channel layer filling an inside of the charge storage layer;

a plurality of word lines orthogonal to and connected to the vertical portions of the at least one string; and two bit lines formed to extend parallel to the horizontal portion of the at least one string, the two bit lines being connected to two ends of a first string of the at least one string.

7. The 3D flash memory of claim 6, wherein each of the two bit lines is selectively usable as either a drain line or a source line.

8. The 3D flash memory of claim 6, wherein the two bit lines are on the same plane as the two ends of the first string of the at least one string and are at the same height.

9. The 3D flash memory of claim 6, wherein a word line adjacent to an upper portion of the horizontal portion of the at least one string, from among the plurality of word lines, is used as a middle signal line (MSL) configured to deplete any one vertical portion of the vertical portions of the at least one string to perform a program operation on a specific memory cell on a remaining vertical portion, and to inject holes to all the vertical portions of the at least one string to perform an erase operation on the at least one string.

10. The 3D flash memory of claim 6, wherein the vertical portions have symmetrical shapes with respect to the horizontal portion.

11. The 3D flash memory of claim 7, configured such that, in response to a case in which one bit line of the two bit lines is used as either the drain line or the source line, the other bit line is used as the other one of the drain line and the source line.

12. The 3D flash memory of claim 7, configured such that each of the two bit lines is selectively used as either the drain line or the source line, based on a required voltage to be applied to the two ends of the at least one string when a program operation, an erase operation or a read operation of the 3D flash memory is performed.

13. The 3D flash memory of claim 8, wherein positions at which the channel layer is formed on cross-sections of the two ends of the at least one string are misaligned from each other so that the channel layer at the two ends of the at least one string is connected to the two bit lines located on the same plane.

14. The 3D flash memory of claim 9, the 3D flash memory configured to apply a ground voltage to an end of a first vertical portion of the vertical portions, to apply a power supply voltage to an end of a second vertical portion of the vertical portions, to apply a blocking voltage for depleting the first vertical portion, and to perform a program operation on a specific memory cell on the second vertical portion.

15. The 3D flash memory of claim 9, the 3D flash memory configured to apply a blocking voltage for maintaining the MSL in an off state to the MSL or to float the MSL, to inject holes to the vertical portions by applying an erase voltage to two ends of the vertical portions, and thus, to perform an erase operation on the at least one string.

16. The 3D flash memory of claim 9, the 3D flash memory configured to apply a read voltage to an end of any one vertical portion in which a specific memory cell to be read is located, from among the vertical portions of the at least one string, and to apply a ground voltage to an end of the remaining vertical portion to float the MSL, and thus, to perform a read operation on the specific memory cell.

17. A operating method of a 3D flash memory including at least one string formed in a U shape to include a horizontal portion and vertical portions with respect to a substrate, the at least one string including a charge storage layer formed to extend in a hollow tube form and a channel layer filling an inside of the charge storage layer; a plurality of word lines orthogonal to and connected to the vertical portions of the at least one string; and two bit lines formed to extend parallel to the horizontal portion of the at least one string, the two bit lines being connected to two ends of the at least one string, the operating method comprising:

determining whether each of the two bit lines will be used as either a drain line or a source line, based on required voltages to be applied to the two ends of the at least one string, depending on which of a program operation, an erase operation, and a read operation is to be performed; and applying voltages to the two ends of the at least one string through the two bit lines based on the result of determining whether each of the two bit lines will be used as either the drain line or the source line, wherein a word line located adjacent to an upper portion of a horizontal portion of the at least one string, from among the plurality of word lines, is used as a MSL (Middle Signal Line).

18. The operating method of claim 17, further comprising:

applying a ground voltage to an end of a first vertical portion among the vertical portions of the at least one string and applying a power supply voltage to an end of a second vertical portion, wherein a specific memory cell on which the program operation is performed is located in the second vertical portion; and performing the program operation on the specific memory cell by applying a blocking voltage for depleting one of the vertical portions to the MSL.

19. The operating method of claim 17, further comprising:

floating the MSL or applying a blocking voltage for maintaining an MSL 2910 in an off state to the MSL; and performing the erase operation on the at least one string by inject holes to the vertical portions to apply an erase voltage to the two ends of the vertical portions included in the at least one string.

20. The operating method of claim 17, further comprising:

applying a read voltage to an end of any one vertical portion in which a specific memory cell to be read is located, from among the vertical portions of the at least one string, and applying a ground voltage to an end of a remaining vertical portion; and performing the read operation on the specific memory cell by floating the MSL.

* * * * *